(12) United States Patent
Abys et al.

(10) Patent No.: US 8,741,390 B2
(45) Date of Patent: Jun. 3, 2014

(54) METALLIC SURFACE ENHANCEMENT

(75) Inventors: Joseph A. Abys, Warren, NJ (US);
Shenliang Sun, Bethany, CT (US);
Chonglun Fan, Portland, OR (US);
Edward J. Kudrak, Jr., Morganville, NJ (US); Cai Wang, Milford, CT (US)

(73) Assignee: Enthone Inc., West Haven, CT (US)

( * ) Notice: Subject to any disclaimer, the term of this patent is extended or adjusted under 35 U.S.C. 154(b) by 991 days.

(21) Appl. No.: 12/596,559

(22) PCT Filed: Apr. 18, 2008

(86) PCT No.: PCT/US2008/060801
§ 371 (c)(1),
(2), (4) Date: Feb. 2, 2010

(87) PCT Pub. No.: WO2008/131206
PCT Pub. Date: Oct. 30, 2008

(65) Prior Publication Data
US 2010/0151263 A1 Jun. 17, 2010

Related U.S. Application Data

(63) Continuation-in-part of application No. 11/736,647, filed on Apr. 18, 2007, now Pat. No. 7,883,738.

(51) Int. Cl.
C23F 11/167 (2006.01)
C23F 11/14 (2006.01)
C23F 11/16 (2006.01)

(52) U.S. Cl.
USPC ...... 427/409; 427/436; 106/14.42; 106/14.44

(58) Field of Classification Search
USPC ........... 427/407.1, 402, 409, 430.1, 435, 436, 427/437; 106/14.05, 14.12, 14.13, 14.15, 106/14.16, 14.18, 14.41, 14.42, 14.44
See application file for complete search history.

(56) References Cited

U.S. PATENT DOCUMENTS

| | | | |
|---|---|---|---|
| 2,080,299 A | 5/1937 | Benning et al. | |
| 3,200,004 A | 8/1965 | Herbst et al. | |
| 3,272,662 A | 9/1966 | Herbst et al. | |
| 3,365,312 A | 1/1968 | Nowack | |
| 3,398,003 A | 8/1968 | Smith et al. | |
| 3,630,790 A | 12/1971 | Schmidt et al. | |
| 3,837,964 A | 9/1974 | Cotton et al. | |
| 3,986,967 A | 10/1976 | Okorodudu | |
| 4,000,012 A | 12/1976 | Burrows et al. | |
| 4,006,026 A | 2/1977 | Dahms | |
| 4,052,160 A | 10/1977 | Cook et al. | |
| 4,165,334 A | 8/1979 | Gosselink et al. | |
| 4,178,253 A | 12/1979 | Lee et al. | |
| 4,181,619 A | 1/1980 | Schmitt et al. | |
| 4,209,487 A | 6/1980 | Hogue et al. | |
| 4,252,662 A | 2/1981 | Marolewski et al. | |
| 4,255,148 A | 3/1981 | Reinwald et al. | |
| 4,303,568 A | 12/1981 | May et al. | |
| 4,329,381 A | 5/1982 | Eschwey et al. | |
| 4,350,600 A | 9/1982 | Sharp et al. | |
| 4,351,945 A | 9/1982 | Brois et al. | |
| 4,357,396 A | 11/1982 | Grunewalder et al. | |
| 4,395,294 A | 7/1983 | Hobbins et al. | |
| 4,649,025 A | 3/1987 | Hwa et al. | |
| 4,734,257 A | 3/1988 | Penninger | |
| 4,744,950 A | 5/1988 | Hollander | |
| 4,865,927 A | 9/1989 | Laig-Horstebrock et al. | |
| 4,873,139 A | 10/1989 | Kinosky | |
| 4,908,241 A | 3/1990 | Quast et al. | |
| 5,064,723 A | 11/1991 | Lawson | |
| 5,091,113 A | 2/1992 | Clubley | |
| 5,103,550 A | 4/1992 | Wefers et al. | |
| 5,141,675 A | 8/1992 | Vanderpool et al. | |
| 5,178,916 A | 1/1993 | Chidsey et al. | |
| 5,226,956 A | 7/1993 | Askew et al. | |
| 5,300,247 A | 4/1994 | Emerich et al. | |
| 5,302,304 A | 4/1994 | Valcho | |
| 5,364,460 A | 11/1994 | Morimoto et al. | |
| 5,368,758 A | 11/1994 | Gapinski | |
| 5,463,804 A | 11/1995 | McCleary et al. | |
| 5,487,792 A | 1/1996 | King et al. | |
| 5,555,756 A | 9/1996 | Fischer et al. | |

(Continued)

FOREIGN PATENT DOCUMENTS

| | | |
|---|---|---|
| EP | 0492487 | 7/1992 |
| EP | 0520649 | 12/1992 |

(Continued)

OTHER PUBLICATIONS

International Search Report, PCT/US2008/060801, dated Jul. 10, 2008, 1 page.
Abstract of JP2004042050; Feb. 12, 2004.
Assouli, B. et al., "Effect of 2-mercaptobenzimidazole and its Polymeric Film on the Corrosion Inhibition of Brass (60/40) in Ammonia Solution", Corrosion Science, 2004, vol. 60, No. 4, pp. 399-407.
Cullen, Donald, "Surface Tarnish and Creeping Corrosion on Pb-Free Circuit Board Finishes", 8 pages, <http://members.ipc.org/IPCLogin/IPCMembers/IPC/Review/0106/0106TechArt.pdf>.
Makhlouf et al., "The Synergistic Effect of Halide Ions and Some Selected Thiols as a Combined Corrosion Inhibitor for Pickling ff Mild Steel in Sulphuric Acid Solution", Materials Chemistry and Physics, 1996, vol. 43, No. 1, pp. 76-82.

(Continued)

*Primary Examiner* — William Phillip Fletcher, III
(74) *Attorney, Agent, or Firm* — Senniger Powers LLP

(57) ABSTRACT

A method and composition for enhancing corrosion resistance, wear resistance, and contact resistance of a device comprising a copper or copper alloy substrate and at least one metal-based layer on a surface of the substrate. The composition comprises a phosphorus oxide compound selected from the group consisting of a phosphonic acid, a phosphonate salt, a phosphonate ester, a phosphoric acid, a phosphate salt, a phosphate ester, and mixtures thereof; an organic compound comprising a nitrogen-containing functional group; and a solvent having a surface tension less than about 50 dynes/cm as measured at 25° C.

39 Claims, 16 Drawing Sheets

(56) References Cited

U.S. PATENT DOCUMENTS

| | | | |
|---|---|---|---|
| 5,618,634 A | 4/1997 | Hosoda et al. | |
| 5,650,385 A | 7/1997 | Dunn et al. | |
| 5,795,409 A | 8/1998 | Hirao et al. | |
| 5,853,797 A | 12/1998 | Fuchs et al. | |
| 5,980,619 A * | 11/1999 | Braig et al. | 106/14.12 |
| 6,102,521 A | 8/2000 | Halko et al. | |
| 6,117,795 A | 9/2000 | Pasch | |
| 6,139,610 A | 10/2000 | Sinko | |
| 6,183,815 B1 | 2/2001 | Enick et al. | |
| 6,248,701 B1 | 6/2001 | Church | |
| 6,375,822 B1 | 4/2002 | Taytsas | |
| 6,383,414 B1 | 5/2002 | Pasch | |
| 6,395,329 B2 | 5/2002 | Soutar et al. | |
| 6,461,682 B1 | 10/2002 | Crotty et al. | |
| 6,586,167 B2 | 7/2003 | Katoh et al. | |
| 6,599,445 B2 | 7/2003 | Meyer | |
| 6,627,329 B1 * | 9/2003 | Shintani | 428/624 |
| 6,646,082 B2 | 11/2003 | Ghosh et al. | |
| 6,731,965 B2 | 5/2004 | Menon et al. | |
| 6,773,757 B1 | 8/2004 | Redline et al. | |
| 6,803,349 B2 | 10/2004 | Negoro et al. | |
| 6,863,718 B2 | 3/2005 | Lamborn et al. | |
| 6,869,637 B2 | 3/2005 | Hutchinson et al. | |
| 6,905,587 B2 | 6/2005 | Redline et al. | |
| 6,911,490 B2 | 6/2005 | Feola et al. | |
| 6,923,692 B2 | 8/2005 | Niebauer | |
| 6,933,046 B1 | 8/2005 | Cook | |
| 7,153,445 B2 | 12/2006 | Bernards et al. | |
| 7,351,353 B1 | 4/2008 | Bernards et al. | |
| 7,399,801 B2 | 7/2008 | Tsuji et al. | |
| 7,524,535 B2 | 4/2009 | Kim et al. | |
| 7,736,730 B2 * | 6/2010 | Jung et al. | 428/323 |
| 2002/0011280 A1 | 1/2002 | Nitowski et al. | |
| 2003/0030034 A1 * | 2/2003 | Meyer | 252/390 |
| 2003/0097957 A1 * | 5/2003 | Lamborn et al. | 106/14.12 |
| 2003/0207774 A1 * | 11/2003 | Negoro et al. | 508/258 |
| 2003/0219622 A1 * | 11/2003 | Niebauer | 428/663 |
| 2004/0048486 A1 | 3/2004 | Bernards et al. | |
| 2004/0249026 A1 * | 12/2004 | Tsuji et al. | 524/81 |
| 2005/0176851 A1 * | 8/2005 | Cook | 523/210 |
| 2005/0181225 A1 * | 8/2005 | Destarac et al. | 428/544 |
| 2005/0217757 A1 | 10/2005 | Miyano | |
| 2005/0239295 A1 * | 10/2005 | Wang et al. | 438/780 |
| 2006/0024430 A1 | 2/2006 | Yau et al. | |
| 2007/0001150 A1 | 1/2007 | Hudgens et al. | |
| 2007/0075120 A1 | 4/2007 | Yang et al. | |
| 2007/0256590 A1 | 11/2007 | Scott et al. | |
| 2008/0108539 A1 | 5/2008 | Kany et al. | |

FOREIGN PATENT DOCUMENTS

| | | |
|---|---|---|
| GB | 1209778 | 10/1970 |
| GB | 2331942 | 6/1999 |
| JP | 57198269 | 12/1982 |
| JP | H07-188942 A | 7/1995 |
| JP | H08-260194 A | 10/1996 |
| JP | H10-326636 A | 12/1998 |
| JP | 2001-279491 A | 10/2001 |
| JP | 2003129257 A | 5/2003 |
| JP | 2004042050 A | 2/2004 |
| JP | 2004300466 A | 10/2004 |
| WO | 9619097 | 6/1996 |
| WO | 97/18905 | 5/1997 |
| WO | 03029227 | 4/2003 |
| WO | 2005073435 A1 | 8/2005 |
| WO | 2005121405 A1 | 12/2005 |
| WO | 2007/120259 | 10/2007 |

OTHER PUBLICATIONS

Mazurkiewicz, Paul, "Accelerated Corrosion of Printed Circuit Boards due to High Levels of Reduced Sulfur Gasses in Industrial Environments", Proceedings of the 23rd International Symposium for Testing and Failure Analysis, Nov. 12-16, 2006, Renaissance Austin Hotel, Austin Texas, USA, pp. 469-473.

Parikh, Atul et al., "An Intrinsic Relationship between Molecular Structure in Self-Assembled n-Alkylsiloxane Monolayers and Deposition Temperature", Journal of Physical Chemistry 1994, vol. 98, 1 page.

Perrin, F. X. et al., "Characterization and Mechanism of Direct Film Formation on a Cu electrode through electro-oxidation of 2-mercaptobenzimidazole", Corrosion Science, 1998, vol. 40, No. 10, pp. 1647-1662.

Song et al., "Synthesis and Characterization of Water-Soluble Polymeric Adhesion Promoter for Epoxy Resin/Copper Joints", Journal of Applied Polymer Science, vol. 85 Issue 10, Sep. 2002, pp. 2202-2210.

Song et al., "Adhesion Improvement of Epoxy Resin/Copper Lead Frame Joints by Azole Compounds", Journal of Adhesion Science and Technology, vol. 12, No. 5, 1998, pp. 541-561.

Tompkins et al., "The Interaction of Imidazole, Benzimidazole and Related Azoles with a Copper Surface", Surface and Interface Analysis, vol. 4, Issue 6, Dec. 1982, pp. 261-266.

Trachli, B., et al., "Protective Effect of Electropolymerized 2-Mercaptobenzimidazole upon Copper Corrosion", Progress in Organic Coating, 2002, vol. 44, pp. 17-23.

Veale, Robert, "Reliability of PCB Alternate Surface Finishes in a Harsh Industrial Environment", Proceedings of the SMTA International Conference, Sep. 25, 2005, 6 pages.

Xue, Gi, et al., "Various Adsorption States of 2-Mercaptobenzimidazole on the Surface of Gold and Silver Studied by Surface Enhanced Raman Scattering", Langmuir, 1994, vol. 10, No. 3, pp. 967-969.

Xue, Gi, et al., "Surface Reaction of 2-Mercaptobenzimidazole on Metals and its application in Adhesion Promotion", Journal of the Chemical Society Faraday Transactions, 1991, vol. 87, No. 8, pp. 1229-1232.

Abstract of JP57198269; Dec. 4, 1982.

Statement of Relevance of foreign references submitted with Information Disclosure Statement.

Abstract of WO2005073435; Aug. 11, 2005.

* cited by examiner

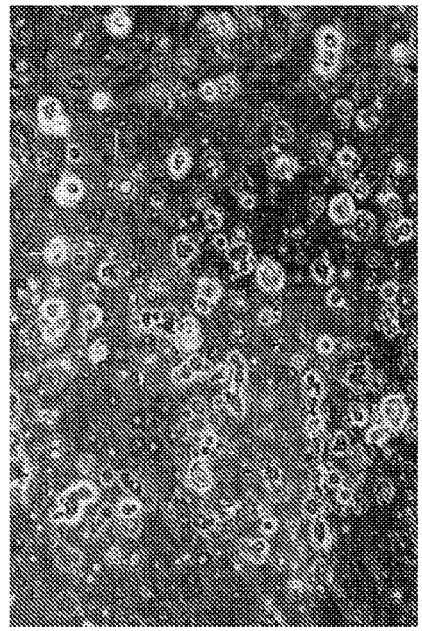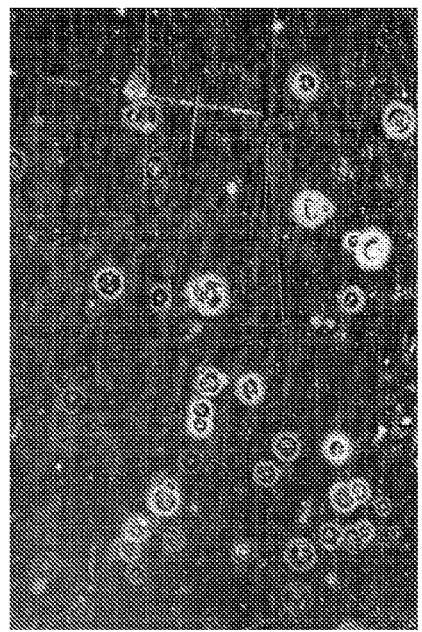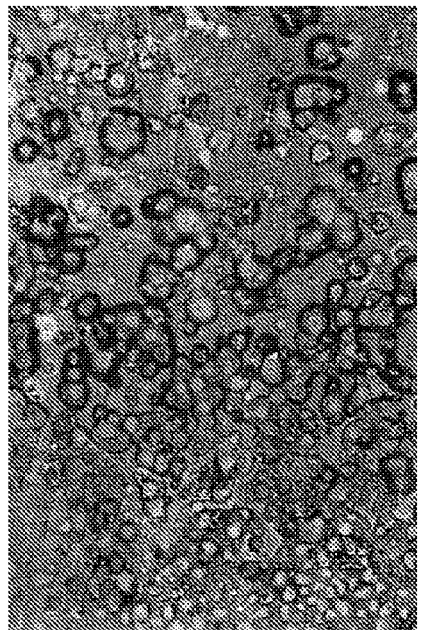

METALLIC SURFACE ENHANCEMENT

REFERENCE TO RELATED APPLICATIONS

This application is a national stage filing based on PCT/US2008/060801 filed 18 Apr. 2008 and is a continuation-in-part application claiming priority to U.S. application Ser. No. 11/736,647 filed 18 Apr. 2007, now U.S. Pat. No. 7,883,738.

FIELD OF THE INVENTION

This invention relates to methods and compositions which improve corrosion protection, solderability, wear resistance, and contact resistance of copper substrates used in the manufacture of electronic and microelectronic devices.

BACKGROUND OF THE INVENTION

Metallic surface coatings are commonly applied to electronic devices and decorative objects to provide corrosion protection and other desired functional properties. Electronic devices comprising copper or copper alloys typically comprise metallic surface coatings which provide corrosion protection, high surface contact resistance, and wear resistance.

In the electronics industry, metallic connectors and lead frames may be coated with surface coatings comprising one or more metallic layers. For example, a metallic surface coating may comprise a base metal underlayer and a precious metal overlayer. In connector manufacture, the base metal underlayer, such as a nickel underlayer, is coated over the copper or copper alloy substrate. The base metal serves as a diffusion barrier. The precious metal overlayer, such as gold, palladium, silver, or alloys thereof, is then coated over the base metal underlayer coating. The precious metal overlayer provides corrosion resistance, wear resistance, and high conductivity. In one metallic surface coating, a nickel underlayer increases the hardness of a gold overlayer. This metallic surface is commonly referred to as "nickel-hardened gold" or simply, "hard gold." In lead frame manufacture, the nickel substrate may be first coated with a palladium layer, which is then over-coated with a gold top coat. Variations on these coatings involve base metal alloy underlayers, precious metal alloy overlayers, and metallic surface coatings comprising two or more base metal underlayers and/or two or more precious metal overlayers.

An obvious disadvantage to the use of precious metals such as gold and palladium is cost. A cost effective connector uses a precious metal coating layer which is as thin as possible, without sacrificing the desired functional properties. Accordingly, the industry typically employs precious metal layer on the order of about 1.0 μm thick on electronic connectors. Thinner layers suffer from the disadvantage of highly increased porosity in the coating. Over time in service, the thin layers having a high degree of porosity are ineffective against base metal and copper diffusion to the surface. In a corrosive environment, the exposed base metal and copper will corrode and the corrosion product(s) can migrate onto the coating surface and deteriorate the surface contact conductivity. Moreover, a thin precious metal layer can wear off during application and shorten the connector's useful lifetime.

For many years in the manufacture of printed circuit boards (PCB), bare boards comprising copper circuitry were finished with eutectic tin-lead solder coating according to the Hot Air Solder Leveling (HASL) process. Due to the Restriction of Hazardous Substances (RoHS) directive, the industry has moved away from using lead as a component of the final finish of bare boards. One alternative final is electroless nickel-immersion gold (ENIG). Another alternative final finish is an immersion displacement layer of silver directly over copper circuitry.

With regard to ENIG alternative final finishes in PCB manufacture, gold may be applied as a metallic surface coating over copper substrates for corrosion resistance and increased wear resistance. Typically, gold is not deposited directly on the copper substrate, but rather on an intervening base metal underlayer. The base metal underlayer, typically electrolessly deposited nickel, is deposited on the copper or copper alloy substrate. The base metal serves as a diffusion barrier. The precious metal overlayer, such as gold, palladium, or alloys thereof, or layers thereof is then deposited, typically by an immersion displacement method, over the base metal underlayer coating. The precious metal overlayer (i.e., gold, palladium, a gold-palladium alloy, or a layer of palladium topped with a layer of gold) provides corrosion resistance, wear resistance, and high conductivity. In the conventional electroless nickel-immersion gold method, an electrolessly deposited nickel underlayer increases the hardness of the immersion plated gold overlayer. ENIG is vulnerable to common pollutants and is sensitive to high humidity and tends to fail due to corrosion.

Another alternative final finish is an immersion displacement layer of silver directly over copper circuitry. The silver is generally deposited by immersion displacement plating, in which silver ions present in the plating composition come into contact with and are reduced by surface copper atoms, according to the following reaction:

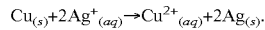
$$Cu_{(s)} + 2Ag^+_{(aq)} \rightarrow Cu^{2+}_{(aq)} + 2Ag_{(s)}.$$

The reduction-oxidation reaction reduces silver ions to silver metal and forms an adhesive silver layer over the copper substrate. The process is self-limiting in that once the copper surface is covered with a layer of silver, copper atoms are no longer accessible to reduce additional silver ions. Typical thicknesses of silver immersion displacement films over copper may range from about 0.05 and about 0.8 microns. See, for example, U.S. Pat. Nos. 5,955,141; 6,319,543; 6,395,329; and 6,860,925, the disclosures of which are hereby incorporated by reference as if set forth in their entireties.

A particular problem observed with immersion-plated precious metal coatings, e.g., silver and gold, as alternative final finishes in PCB manufacture is creep corrosion of copper salts at certain bare copper interfaces between copper and precious metal. For example, immersion silver displacement plating processes may not sufficiently coat copper wiring in PCB, particularly at plated through holes and high aspect ratio blind vias. Corrosion at these locations manifests itself as an annular ring surrounding the vias and plated through holes.

Moreover, silver is susceptible to sulfidation by reduced sulfur compounds (e.g., hydrogen sulfide) present in the environment, particularly at paper processing plants, rubber processing plants, and high pollution environments. Sufficient sulfidation of silver can result in localized pores, which may expose copper to the environment. Humidity and environmental pollutants can oxidize and sulfidize the copper, forming copper salts that may creep through pores in the silver layer.

A need continues to exist in the connectors industry for a metallic coating surface which uses as little precious metal as possible while still retaining advantages the precious metal overlayer provides. Moreover, a need continues to exist for ENIG and immersion silver final finishes over copper circuitry in PCB manufacture that are less vulnerable to corrosion.

SUMMARY OF THE INVENTION

Among the aspects of the present invention may be noted a composition and method for enhancing the wear resistance, corrosion resistance, and contact resistance of a copper or copper alloy device which is coated with a base metal layer. The base metal layer may, in turn, be a base metal underlayer that is coated with a precious metal overlayer. The present invention enables the use of ultra-thin precious metal overlayers, while still retaining the advantages of corrosion resistance, wear resistance, and contact resistance.

Briefly, therefore, the invention is directed to a composition for enhancing corrosion resistance, wear resistance, and contact resistance of a device comprising a copper or copper alloy substrate and at least one metal-based layer on a surface of the substrate. The composition comprises a phosphorus oxide compound selected from the group consisting of a phosphonic acid, a phosphonate salt, a phosphonate ester, a phosphoric acid, a phosphate salt, a phosphate ester, and mixtures thereof; an organic compound comprising a nitrogen-containing functional group selected from the group consisting of amine, aromatic heterocycle comprising nitrogen, and a combination thereof; and a solvent having a surface tension less than about 50 dynes/cm as measured at 25° C.

The invention is further directed to a method for enhancing the corrosion resistance, wear resistance, and contact resistance of a device comprising a copper or copper alloy substrate and at least one metal-based layer on a surface of the substrate. The method comprises exposing the device to a composition comprising a phosphorus oxide compound selected from the group consisting of a phosphorus oxide compound selected from the group consisting of a phosphonic acid, a phosphonate salt, a phosphonate ester, a phosphoric acid, a phosphate salt, a phosphate ester, and mixtures thereof; an organic compound comprising a nitrogen-containing functional group selected from the group consisting of amine, aromatic heterocycle comprising nitrogen, and a combination thereof; and a solvent having a surface tension less than about 50 dynes/cm as measured at 25° C.

The invention is further directed to An electronic device comprising a copper substrate having a surface; and a base metal underlayer having a surface deposited on the surface of the copper substrate. Further, the surface of the copper substrate comprises a first protective organic film comprising an aromatic heterocycle comprising nitrogen; and the surface of the base metal underlayer comprises a second protective organic film comprising a phosphorus oxide compound selected from the group consisting of a phosphonic acid, a phosphonate salt, a phosphonate ester, a phosphoric acid, a phosphate salt, a phosphate ester, and mixtures thereof.

Other objects and features will be in part apparent and in part pointed out hereinafter.

BRIEF DESCRIPTION OF THE FIGURES

FIGS. 14A through 14D are photomicrographs of copper coupons coated with nickel underlayers and gold overlayers.

Figure 1:
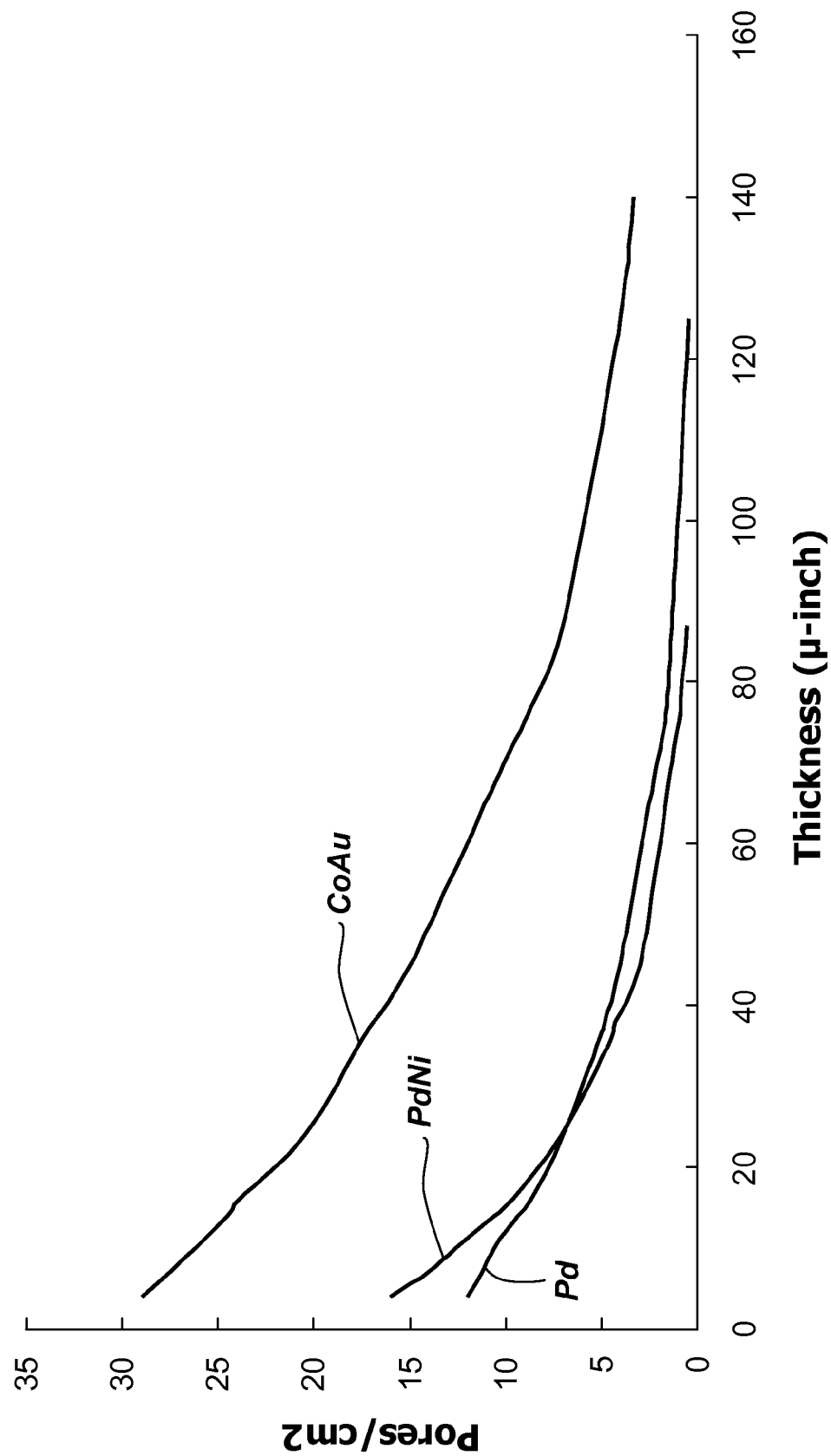
FIG. 1 is a graph showing the increase in porosity as a film comprising cobalt-hardened gold decreases in thickness.

These reference coupons were not treated with surface treatment composition prior to being subjected to a high temperature reflow followed by porosity testing as described in Example 10.

FIGS. 15A through 15D are photomicrographs of copper coupons coated with nickel underlayers and gold overlayers. These reference coupons were treated with surface treatment composition of the present invention prior to being subjected to a higher temperature reflow followed by porosity testing as described in Example 10.

FIGS. 16A through 16D are photomicrographs of copper coupons coated with nickel underlayers and gold overlayers. These reference coupons were treated with surface treatment composition of the present invention prior to being subjected to a high temperature reflow followed by porosity testing as described in Example 10.

DETAILED DESCRIPTION OF EMBODIMENT(S) OF THE INVENTION

The present invention is directed to a surface treatment method and a surface treatment composition for applying a protective organic film to a metallic surface coating, particularly a metallic surface coating on a copper substrate. The surface treatment has been found effective in enhancing the corrosion resistance, contact resistance, and wear resistance of a metallic surface coating comprising a precious metal overlayer significantly thinner than 1.0 µm. Copper substrates suitable for protection with the organic protective film of the invention include copper circuitry in printed circuit boards (PCB), chip carriers, semiconductor substrates, metal lead frames, connectors, and other solderable copper substrates. An exemplary metallic surface coating comprises a base metal layer. Another exemplary metallic surface coating comprises a base metal underlayer and a precious metal overlayer.

The surface treatment method comprises exposing the copper substrate having a metallic surface coating to a surface treating composition comprising additives which are effective at blocking pores which may be present in the base metal underlayer and, if present, the precious metal overlayer. Accordingly, the compositions of the present invention can effectively block pores down to the copper or copper alloy substrate. This enhanced pore blocking is more effective for inhibiting corrosion, enhancing wear and contact resistance, and prolonging the useful service life of electronic devices in comparison with compositions known in the art. Although this invention is described in the context of electronic devices, the surface treatment method and surface treatment composition are applicable to any object comprising a copper or copper alloy substrate with a metallic surface coating thereon.

The present invention is therefore further directed to such a surface treatment composition. The surface treatment composition for use in the surface treatment of the present invention comprises a phosphorus oxide compound, an organic compound comprising a nitrogen-containing functional group, such as an amine or aromatic heterocycle comprising nitrogen, and a solvent. Optionally, the composition further comprises an organic compound comprising a sulfur-containing functional group, such as alkyl thiol or disulfide, which provides additional protection over the copper and copper alloy substrate and, if present, a precious metal overlayer. Preferably, the solvent is a low surface tension solvent.

The surface treating composition of the present invention comprises a phosphorus oxide compound. The phosphorus oxide compound is added to the surface treatment composition to react with and impart a protective organic film over a base metal layer. The phosphorus oxide compound may also fill in pores which may be present in a precious metal overlayer. In order to achieve cost-savings, if used, the precious metal overlayer is preferably ultra-thin, i.e., substantially thinner than the approximately 1 µm to 2 µm thick precious metal coatings known in the art. The drawback to thin precious metal overlayers is rapidly increasing porosity as a function of decreases in thickness. See FIG. 1, which is a graph showing porosity increases as the thickness of the precious metal overlayer decreases. Porosity increases are especially notable at thicknesses below 1 µm. Accordingly, phosphorous oxide compounds are added to the surface treating composition of the present invention to react with base metal exposed by pores in the precious metal overlayer. The base metal exposed by pores in the precious metal overlayer can be easily oxidized in an oxygen-containing corrosive environment, such that it contains metal oxides and metal hydroxides on its surface. Advantageously, base metal oxide and metal hydroxide on the surface of the base metal layer reacts with phosphorous oxide compounds to form a chemical bond between the metal oxide and metal hydroxide and phosphorus oxide compound. The reaction between an exemplary base metal, such as nickel having surface hydroxides, and an exemplary phosphorus oxide occurs as shown:

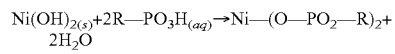

Figure 2:
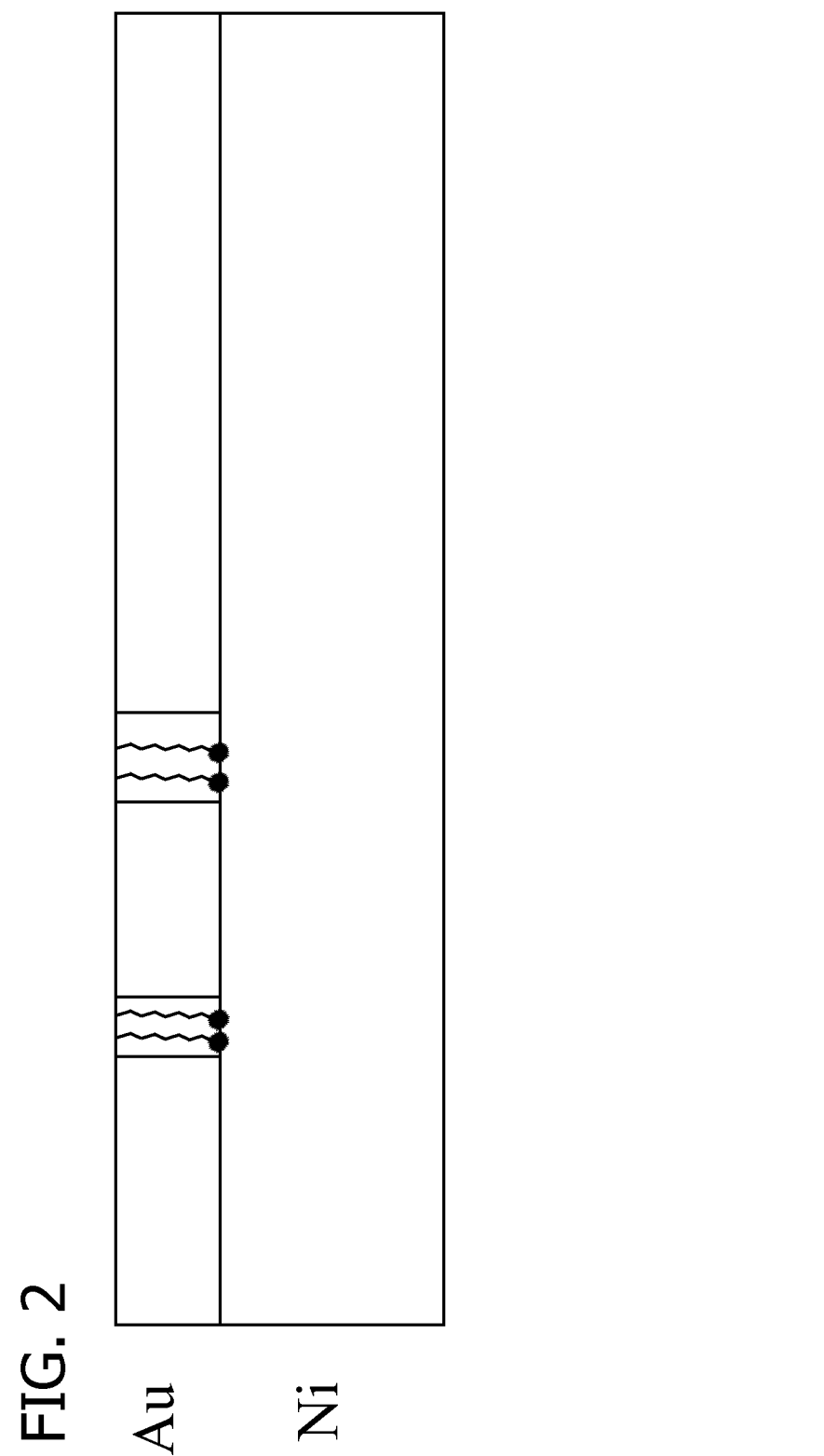
FIG. 2 is a depiction of a phosphorus oxide compound forming a protective film over a nickel underlayer by reacting with nickel oxide which may be present on the surface of the nickel underlayer. The phosphorus oxide compound further fills in pores in the gold overlayer.

Each phosphorus oxide having the general structure shown in the above reaction can react with one, two, or three oxygen atoms on the surface of the base metal layer. The reaction causes the phosphorus oxide compound to be chemically bonded to the base metal oxide on the surface of the base metal layer while also filling in pores in the precious metal underlayer as shown in FIG. 2. In this regard, it is to be noted that phosphorus oxides react with oxides and hydroxides of tin, nickel, zinc, chromium, iron, titanium, and aluminum, among other metals.

Phosphorus oxide compounds suitable for adding to the compositions of the present invention preferably have a structure similar to micellular surfactants, i.e., having a hydrophilic head group and a hydrophobic component. As stated above, the hydrophilic head group comprising the phosphorus oxide moiety reacts with and bonds to metal oxides and hydroxides in a self-assembling reaction. The hydrophobic component forms a densely packed hydrophobic film on the surface of the base metal, e.g., tin or nickel, that repels water and environmental humidity. Accordingly, the phosphorus oxide compounds preferably comprise phosphate or phosphonate moieties bonded to a hydrophobic group. For example, the hydrophobic group bonded to the phosphate or phosphonate moiety can be an alkyl group, an aryl group, an arylalkyl, or an alkylaryl group.

An exemplary phosphorus oxide compound is a phosphonate derivative having the following general structure (I):

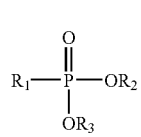

Structure (I)

wherein $R_1$ is a hydrocarbyl having between one carbon atom and 24 carbon atoms, such as between two carbon atoms and 24 carbon atoms; and $R_2$ and $R_3$ are each independently or together hydrogen, a charge balancing cation, or a hydrocarbyl having between one carbon atom and four carbon atoms. The $R_1$ hydrocarbyl may be branched-chained or straight-chained, substituted or unsubstituted. The $R_1$ hydrocarbyl may comprise alkyl, alkenyl, alkynyl, aryl, or combinations thereof, such as alkylaryl or arylalkyl. For example, the $R_1$ hydrocarbyl may comprise a phenyl group bonded to the phosphorus atom to which is bonded a hydrocarbyl chain, such as an alkyl chain having from one to 18 carbon atoms. In another example, the $R_1$ hydrocarbyl may comprise an alkyl chain having from one to 18 carbon atoms bonded to the phosphorus atom and further comprising a phenyl group. Preferably, the $R_1$ hydrocarbyl comprises an alkyl chain comprising between about two carbon atoms and about 24 carbon atoms, preferably between about two carbon atoms and 22 carbon atoms, more preferably between about four carbon atoms and 22 carbon atoms, even more preferably between about six carbon atoms and about 18 carbon atoms, yet more preferably between about eight and about 18 carbons.

Unless otherwise indicated, a substituted hydrocarbyl is substituted with at least one atom other than carbon, including moieties in which a carbon chain atom is substituted with a hetero atom such as nitrogen, oxygen, silicon, phosphorous, boron, sulfur, or a halogen atom. The hydrocarbyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

$R_2$ and/or $R_3$ may be hydrogen; in this case, the phosphorus oxide compound is a phosphonic acid. $R_2$ and/or $R_3$ may be a charge balancing metal cation such as lithium, potassium, sodium, or calcium. The charge balancing cation may also be ammonium. When $R_2$ and/or $R_3$ comprise charge balancing cation (other than hydrogen), the phosphorus oxide compound is a phosphonate salt. $R_2$ and/or $R_3$ may be a hydrocarbyl such as methyl, ethyl, n-propyl, isopropyl, n-butyl, isobutyl, and tert-butyl. When $R_2$ and/or $R_3$ are hydrocarbyl, the phosphorus oxide compound is a phosphonate ester.

The phosphorus oxide compound may comprise a phosphonic acid, a phosphonate salt, a phosphonate ester, or a mixture thereof. Exemplary phosphorus oxide compounds having phosphonate moieties bonded the alkyl groups applicable for use in the surface treating compositions of the present invention include methylphosphonic acid, dimethylphosphinic acid, ethylphosphonic acid, n-propylphosphonic acid, isopropylphosphonic acid, n-butylphosphonic acid, iso-butylphosphonic acid, tert-butylphosphonic acid, pentylphosphonic acids, hexylphosphonic acids, heptylphosphonic acids, n-octylphosphonic acid, n-decyl phosphonic acid, n-dodecyl phosphonic acid, (12-Phosphonododecyl)phosphonic acid, n-tetradecyl phosphonic acid, n-hexadecyl phosphonic acid, n-octadecyl phosphonic acid, diisooctylphosphinic acid, their salts, and their esters. Exemplary phosphorus oxide compounds having phosphonate moieties bonded the other hydrocarbyl types applicable for use in the surface treating compositions of the present invention include methylenediphosphonic acid, vinylphosphonic acid, allylphosphonic acid, phenyl phosphonic acid, diphenylphosphinic acid, (2-isopropylphenyl)phosphonic acid, benzyl phosphonic acid, (ortho-tolyl)phosphonic acid, (meta-tolyl) phosphonic acid, (para-tolyl)phosphonic acid, (4-ethylphenyl)phosphonic acid, (2,3-xylyl)phosphonic acid, (2,4-xylyl) phosphonic acid, (2,5-xylyl)phosphonic acid, (3,4-xylyl) phosphonic acid, (3,5-xylyl)phosphonic acid, their salts, and their esters. Among the suitable compounds are, for example, decylphosphonic acid, octylphosphonic acid, vinylphosphonic acid, and a petroleum 10 naphtha (ZC-026) from Zip-Chem Products (Morgan Hill, Calif.). Also among the suitable compounds are, for example, bifunctional molecules such as phosphonic acid compounds comprising carboxylic acid moieties, such as phosphonoacetic acid, 3-phosphonopropionic acid, 6-phosphonohexanoic acid, 11-phosphonoundecanoic acid, 16-phosphonohexadecanoic acid, their salts, and their esters.

Another exemplary phosphorus oxide compound is a phosphate derivative having the following general structure (II):

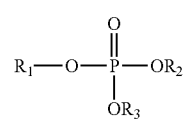

Structure (II)

wherein $R_1$ is a hydrocarbyl having between one carbon atom and 24 carbon atoms, such as between two carbon atoms and 24 carbon atoms; and $R_2$ and $R_3$ are each independently or together hydrogen, a charge balancing cation, or a hydrocarbyl having between one carbon atom and four carbon atoms. The $R_1$ hydrocarbyl may be branched-chained or straight-chained, substituted or unsubstituted. The $R_1$ hydrocarbyl may comprise alkyl, alkenyl, alkynyl, aryl, or combinations thereof, such as alkylaryl or arylalkyl. For example, the $R_1$ hydrocarbyl may comprise a phenyl group bonded to the oxygen atom to which is bonded a hydrocarbyl chain, such as an alkyl chain having from one to 18 carbon atoms. In another example, the $R_1$ hydrocarbyl may comprise an alkyl chain having from one to 18 carbon atoms bonded to the oxygen atom and further comprises a phenyl group. Preferably, the $R_1$ hydrocarbyl comprises an alkyl chain comprising between about two carbon atoms and about 24 carbon atoms, preferably between about two carbon atoms and 22 carbon atoms, more preferably between about four carbon atoms and 22 carbon atoms, even more preferably between about six carbon atoms and about 18 carbon atoms, yet more preferably between about eight and about 18 carbons.

Unless otherwise indicated, a substituted hydrocarbyl is substituted with at least one atom other than carbon, including moieties in which a carbon chain atom is substituted with a hetero atom such as nitrogen, oxygen, silicon, phosphorous, boron, sulfur, or a halogen atom. The hydrocarbyl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

$R_2$ and/or $R_3$ may be hydrogen; in this case, the phosphorus oxide compound is a phosphoric acid. $R_2$ and/or $R_3$ may be a charge balancing metal cation such as lithium, potassium, sodium, or calcium. The charge balancing cation may also be ammonium. When $R_2$ and/or $R_3$ comprise charge balancing cation (other than hydrogen), the phosphorus oxide compound is a phosphate salt. The $R_2$ and/or $R_3$ may be a hydrocarbyl such as methyl, ethyl, n-propyl, isopropyl, n-butyl, isobutyl, and tert-butyl. When $R_2$ and/or $R_3$ are hydrocarbyl, the phosphorus oxide compound is a phosphate ester.

The phosphorus oxide compound may comprise a phosphoric acid, a phosphate salt, a phosphate ester, or a mixture thereof. Exemplary phosphorus oxide compounds having phosphate moieties bonded to alkyl groups applicable for use in the surface treating compositions of the present invention include ethylphosphoric acid, diethyl phosphate, n-propylphosphoric acid, isopropylphosphoric acid, diisopropyl phosphate, n-butylphosphoric acid, dibutyl phosphate, tert-butylphosphoric acid, triisobutylphosphate, pentylphosphoric acids, hexylphosphoric acids, heptylphosphoric acids, n-octylphosphoric acid, n-decyl phosphoric acid, n-undecyl phosphoric acid, n-dodecyl phosphoric acid, n-tridecyl phosphoric acid, n-tetradecyl phosphoric acid, n-hexadecyl phosphoric acid, n-octadecyl phosphoric acid, their salts, and their esters. Exemplary phosphorus oxide compounds having phosphate moieties bonded to other hydrocarbyl types applicable for use in the surface treating compositions of the present invention include allyl phosphate, phenyl phosphate, diphenyl phosphate, 1-naphthyl phosphate, 2-naphthyl phosphate, their salts, and their esters.

The phosphorus oxide compound may be added to the surface treating compositions of the present invention at a concentration between about 0.01% by weight (about 0.1 g/L) and about 10% by weight (about 100 g/L), preferably between about 0.1% by weight (about 1 g/L) and about 5% by weight (about 50 g/L), more preferably between about 0.1% by weight (about 1 g/L) and about 2% by weight (about 20 g/L), such as about 1% by weight (about 10 g/L). The phosphorus oxide compound is preferably added to the composition in at least about 0.01% by weight (about 0.1 g/L) to achieve rapid coating. The maximum concentration of about 10% by weight (about 100 g/L) is determined by the phosphorus oxide compound's solubility and therefore may be higher or lower than the stated amount depending upon the identity of the phosphorus oxide compound. In a preferred composition, the compound is n-octadecyl phosphonic acid added in a concentration between about 0.2% by weight (about 2.0 g/L) and about 2% by weight (about 20.0 g/L) for example, about 1% by weight (about 10 g/L) or about 12.4 g/L.

Figure 3:
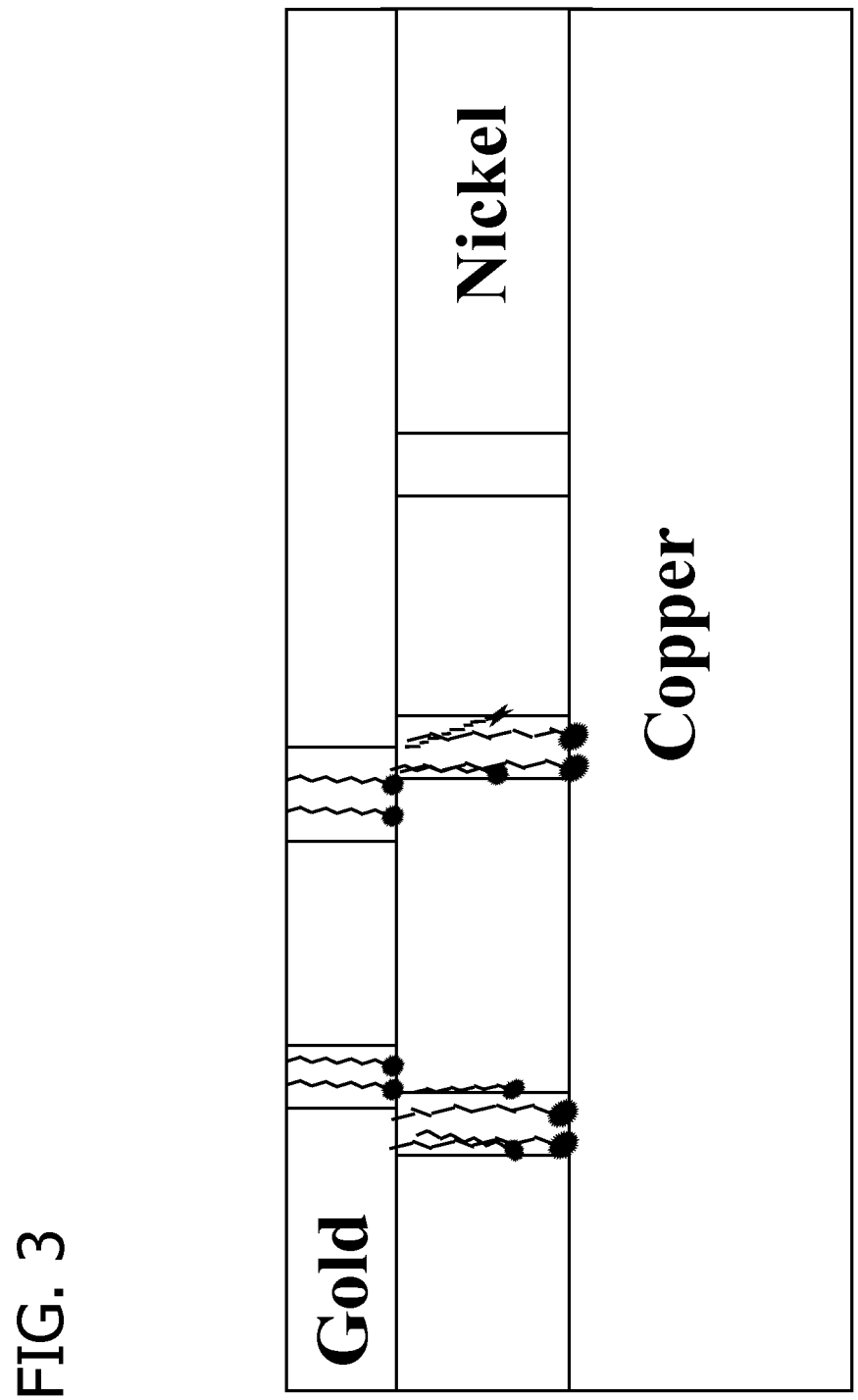
FIG. 3 is a depiction of a phosphorus oxide compound forming a protective film over a nickel underlayer by reacting with nickel oxide which may be present on the surface of the nickel underlayer and an aromatic heterocycle comprising nitrogen forming a protective film over a copper or copper alloy substrate by reacting with surface copper. The phosphorus oxide compound further fills in pores in the gold overlayer and the aromatic heterocycle comprising nitrogen fills in pores in the nickel underlayer.
Figure 4:
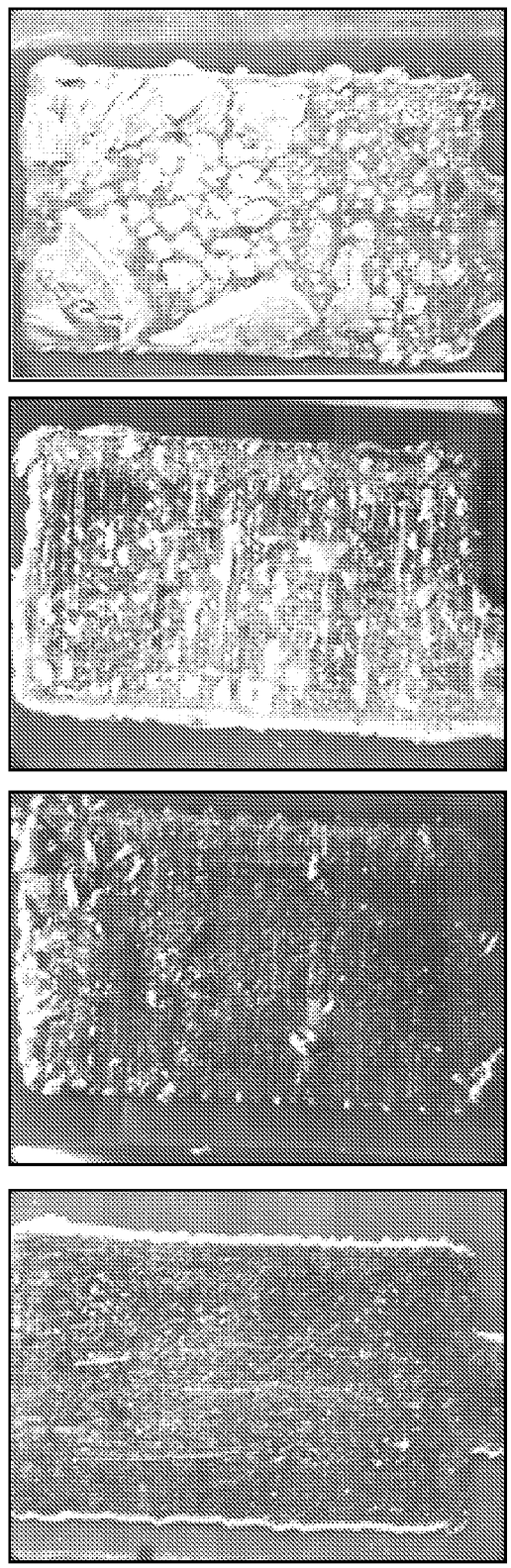
FIG. 4 are examples of electronic connectors showing light (A), moderate (B), severe (C), and total (D) surface coverage of copper oxides which developed over their service lives and which can be attributed to porous metallic surface coatings.

The surface treating composition of the present invention further comprises an organic compound comprising a nitrogen-containing functional group, such as an amine or aromatic heterocycle comprising nitrogen. The amine and/or aromatic heterocycle comprising nitrogen is added to the surface treatment composition to react with and protect the copper or copper alloy substrate. While ultra-thin precious metal overlayers are characterized by increased porosity (see FIG. 1), the base metal underlayer may also be characterized by a certain degree of porosity. Accordingly, it has been observed that continuous pores may exist through the precious metal overlayer and base metal. Refer to FIG. 3 for a depiction of pores which penetrate through to the copper or copper alloy substrate. Porous base metal underlayers and precious metal overlayers characterized by pores which penetrate to the copper or copper alloy substrate are ineffective at inhibiting copper diffusion from the substrate to the surface and are ineffective at protecting the copper from corrosion. Accordingly, over time, copper (I) and (II) oxides may form and cover the surfaces of electronic connectors and PCB substrates. Severe oxide formation can render electronic connectors non-conductive and useless for their intended purpose. See FIG. 4 for examples of electronic connectors showing light (A), moderate (B), severe (C), and total (D) surface coverage of copper oxides which developed over their service lives and which can be attributed to porous metallic surface coatings.

Because of problems relating to the porosity of the base metal underlayer, surface treating the electronic connector with a composition comprising a phosphorus oxide compound may be insufficient to prevent corrosion related copper oxide coverage of the component surface. Accordingly, the compositions of the present invention further comprise an organic compound comprising a nitrogen-containing functional group, such as an amine or an aromatic heterocycle comprising nitrogen, which reacts with the copper or copper alloy substrate and fills in pores in the base metal underlayer. Pore blocking using amines and/or aromatic heterocycles comprising nitrogen provides further protection against copper diffusion to the surface of the electronic connector. Copper ions can form complexes with compounds comprising amine and heterocyclic functionality. Some of these complexes, such as the complex between copper ions and benzotriazole, are insoluble. Without being bound to a particular theory, it is thought that upon exposure of the copper or copper alloy surface, copper(I) ions on the copper surface and copper(II) ions in solution complex with the nitrogen in the aromatic heterocycle. These complexes precipitate over the copper surface, forming a protective film over exposed areas of the copper or copper alloy. Alternatively, without being bound to a particular theory, it is also thought that an electron pair in the amine functional group forms a nitrogen-copper bond, thereby forming a self-assembled monolayer film over the copper conducting layer, wherein the film comprises the nitrogen atom of the amine bonded to the copper surface.

In one embodiment, the amine is a primary amine, secondary amine, or a tertiary amine having the following general structure (III):

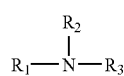

Structure (III)

wherein $R_1$, $R_2$, and $R_3$ are each independently hydrogen or a hydrocarbyl having between one carbon atom and about 24 carbon atoms, and at least one of $R_1$, $R_2$, and $R_3$ is a hydrocarbyl having between one carbon atom and about 24 carbon atoms. The hydrocarbyl preferably comprises between about six carbon atoms and about 18 carbon atoms. The hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, napthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers.

In one preferred embodiment, one of $R_1$, $R_2$, and $R_3$ is an unsubstituted hydrocarbyl and a straight chained alkyl while two of $R_1$, $R_2$, and $R_3$ are hydrogen, since a primary amine comprising a straight-chained alkyl better achieves a desirable densely packed self-assembled monolayer over a copper surface. Exemplary primary amines applicable for use in the composition of the present invention, singly or in combination, include aminoethane, 1-aminopropane, 2-aminopropane, 1-aminobutane, 2-aminobutane, 1-amino-2-methylpropane, 2-amino-2-methylpropane, 1-aminopentane, 2-aminopentane, 3-aminopentane, neo-pentylamine, 1-aminohexane, 1-aminoheptane, 2-aminoheptane, 1-aminooctane, 2-aminooctane, 1-aminononane, 1-aminodecane, 1-aminododecane, 1-aminotridecane, 1-aminotetradecane, 1-aminopentadecane, 1-aminohexadecane, 1-aminoheptadecane, and 1-aminooctadecane.

In another embodiment, two of $R_1$, $R_2$, and $R_3$ are unsubstituted hydrocarbyls and straight chained alkyls while one of $R_1$, $R_2$, and $R_3$ is hydrogen, such that the amine is a secondary amine Exemplary secondary amines applicable for use in the composition of the present invention, singly or in combination with other amines, include diethylamine, dipropylamines, dibutylamines, dipentylamines, dihexylamines, diheptylamines, dioctylamines, dinonylamines, didecylamines, diundecylamines, didodecylamines, ditridecylamines, ditetradecylamines, dihexadecylamines, dioctadecylamines, and others.

Tertiary amines, in which all of $R_1$, $R_2$, and $R_3$ are unsubstituted hydrocarbyls and straight chained alkyls, include triethylamine, tripropylamines, tributylamines, tripentylamine, trihexylamines, triheptylamines, trioctylamines, trinonylamines, tridecylamines, triundecylamines, tridodecylamines, tritridecylamines, tritetradecylamines, trihexadecylamines, trioctadecylamines, and others.

Also applicable are organic functional molecules comprising two or more amine, such as ethylenediamine, 2-(Diisopropylamino)ethylamine, N,N'-Diethylethylenediamine, N-Isopropylethylenediamine, N-Methylethylenediamine, N,N-Dimethylethylenediamine, 1-dimethylamino-2-propylamine, 3-(Dibutylamino)propylamine, 3-(Diethylamino)propylamine, 3-(Dimethylamino)-1-propylamine, 3-(Methylamino)propylamine, N-Methyl-1,3-diaminopropane, N,N-Diethyl-1,3-propanediamine, and others.

In another embodiment, the organic functional group that interacts with and protects copper surfaces is an aromatic heterocycle comprising nitrogen. It is thought that aromatic heterocycles comprising nitrogen additionally protect copper surfaces by interacting with copper(I) ions on the surface of the copper conducting layer. Interaction with copper(I) ions forms a film comprising insoluble copper(I)-based organometallics that precipitate on the surface of the copper conducting layer. This precipitate is also thought to be another mechanism whereby amines, particularly heterocyclic, aromatic amines, form a protective organic film on the surface of the copper conducting layer.

Aromatic heterocycles comprising nitrogen suitable for the use in the composition of the present invention comprise nitrogen in a 5-membered ring (azoles). The 5-membered can be fused to another 5-membered or 6-membered aromatic ring, which can also be a heterocyclic ring comprising a nitrogen atom. Further, the aromatic heterocycle can comprise one or more nitrogen atoms, and typically, the aromatic heterocycle comprises between one and four nitrogen atoms. Azoles can have the following general structure (IV):

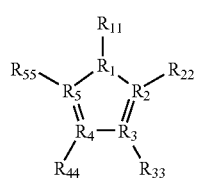

Structure (IV)

wherein each of $R_1$, $R_2$, $R_3$, $R_4$, and $R_5$ is an atom selected from the group consisting of carbon and nitrogen, wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and $R_{11}$, $R_{22}$, $R_{33}$, $R_{44}$, and $R_{55}$ are each independently selected from the group consisting of hydrogen, carbon (e.g., alkyl, alkenyl, alkynyl, aryl, alkylaryl, arylalkyl), sulfur (e.g., sulfhydryl or thioether), oxygen (e.g., hydroxyl or alkoxy), nitrogen (e.g., amino or nitro), and halide (e.g., chloride, bromide, iodide).

Any one or more of $R_{11}$, $R_{22}$, $R_{33}$, $R_{44}$, and $R_{55}$ of structure (IV) may be carbon wherein the carbon is part of an aliphatic group having between one carbon atom and 24 carbon atoms. The aliphatic group may be substituted or unsubstituted. The aliphatic group may be branched-chained or straight-chained. Unless otherwise indicated, a substituted aliphatic group is substituted with at least one atom other than carbon, including moieties in which a carbon chain atom is substituted with a hetero atom such as nitrogen, oxygen, silicon, phosphorous, boron, sulfur, or a halogen atom. The aliphatic group may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

In structure (IV), any pair of consecutive $R_{11}$, $R_{22}$, $R_{33}$, $R_{44}$, and $R_{55}$ (e.g., $R_{11}$ and $R_{22}$ or $R_{22}$ and $R_{33}$) can together with the carbon or nitrogen atoms to which they are bonded form a substituted or unsubstituted cycloalkyl or substituted or unsubstituted aryl group with the corresponding pair of consecutive $R_1$, $R_2$, $R_3$, $R_4$, and $R_5$ (e.g., $R_{11}$ and $R_{22}$ form a ring with $R_1$ and $R_2$) such that the ring defined by the $R_1$, $R_2$, $R_3$, $R_4$, and $R_5$ groups is fused to another ring. This ring may comprise one or two nitrogen atoms. Preferably, the consecutive $R_{11}$, $R_{22}$, $R_{33}$, $R_{44}$, and $R_{55}$ and the corresponding consecutive $R_1$, $R_2$, $R_3$, $R_4$, and $R_5$ form a six-membered aromatic ring. The aryl group may be substituted. Unless otherwise indicated, a substituted aryl group is substituted with at least one atom other than carbon, including moieties in which a carbon chain atom is substituted with a hetero atom such as nitrogen, oxygen, silicon, phosphorous, boron, sulfur, or a halogen atom. The aryl may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters, and ethers.

In one embodiment, the azole of structure (IV) is not substituted. Exemplary unsubstituted azoles applicable for use in the composition of the present invention are shown in Table 1, including pyrrole (1H-azole); imidazole (1,3-diazole); pyrazole (1,2-diazole); 1,2,3-triazole; 1,2,4-triazole; tetrazole; isoindole; benzimidazole (1,3-benzodiazole); indazole (1,2-benzodiazole); 1H-benzotriazole; 2H-benzotriazole; imidazo[4,5-b]pyridine; indole (1H-Benzo[b]pyrrole); purine (7H-Imidazo(4,5-d)pyrimidine); pyrazolo[3,4-d]pyrimidine; and Triazolo[4,5-d]pyrimidine. Preferred unsubstituted azoles include imidazole, triazole, pyrazole, benzimidazole, purine, imidazo[4,5-b]pyridine, and benzotriazole. Among these, benzimidazole is particularly preferred.

TABLE 1

| Azoles | |
|---|---|
| Name | Structure |
| Pyrrole (1H-azole) | |
| Imidazole (1,3-diazole) | |
| Pyrazole (1,2-diazole) | |

TABLE 1-continued

Azoles

| Name | Structure |
|---|---|
| 1,2,3-triazole | |
| 1,2,4-triazole | |
| Tetrazole | |
| Isoindole | |
| Indole (1H-Benzo[b]pyrrole) | |
| Benzimidazole (1,3-benzodiazole) | |
| Indazole (1,2-benzodiazole) | |
| 1H-Benzotriazole | |
| 2H-Benzotriazole | |
| Imidazo[4,5-b]pyridine | |
| Purine (7H-Imidazo(4,5-d)pyrimidine) | |
| Pyrazolo[3,4-d]pyrimidine | |
| Triazolo[4,5-d]pyrimidine | |

In one embodiment, the azole of structure (IV) is a substituted azole. That is, one or more of the hydrogen atoms bonded to the carbon atoms and/or nitrogen atoms present in any of the azoles whose structures are shown in above Table 1 may be substituted with a functional group as described above in connection with Structure IV, and are therefore derivatives of the azoles shown in Table 1. In one embodiment, the azole compound is a substituted imidazole, which has the following general structure (V):

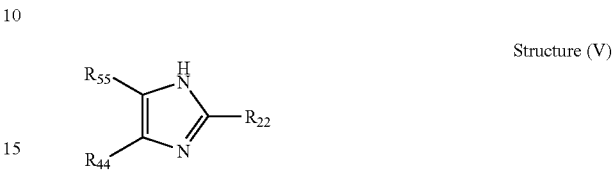

Structure (V)

wherein $R_{22}$, $R_{44}$, and $R_{55}$ are as defined in connection with structure (IV).

In one embodiment, the azole compound is a 2-substituted imidazole, which has the following general structure (VI):

Structure (VI)

wherein $R_{22}$ is as defined in connection with structure (IV).

In one embodiment, the azole compound is a 2,4-substituted imidazole, which has the following general structure (VII):

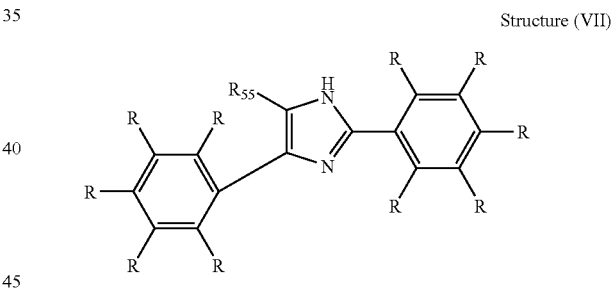

Structure (VII)

Wherein $R_{55}$ may be hydrogen or methyl, and the various R groups may be hydrogen, alkyl, halide, alkoxy, alkylamino, cyano, and nitro. Preferably, the A groups are hydrogen or halide. The halide may be chloride, bromide, or iodide, and preferably, the halide is chloride.

In one embodiment, the azole compound is a benzimidazole derivative, which has the following general structure (VIII):

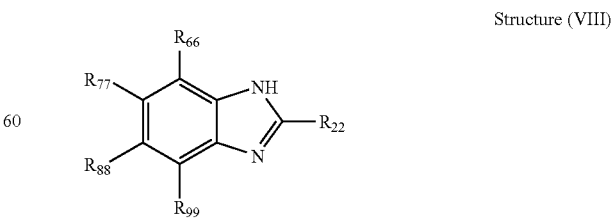

Structure (VIII)

wherein $R_{22}$ is as defined in connection with structure (IV); and $R_{66}$, $R_{77}$, $R_{88}$, and $R_{99}$ are independently selected from among hydrogen, halide, nitro, and substituted or unsubstituted hydrocarbyl, substituted or unsubstituted alkoxy, substituted or unsubstituted amino, and cyano.

In the context of structure (VIII), the halide may be selected from among chloride, bromide, and iodide. Preferably, the halide is chloride.

Moreover, the substituted or unsubstituted hydrocarbyl may be selected from among substituted or unsubstituted alkyl, substituted or unsubstituted alkenyl, substituted or unsubstituted alkynyl, and substituted or unsubstituted aryl. The substituted or unsubstituted hydrocarbyl typically has from one to about twenty five carbon atoms, more typically from one to about twelve carbon atoms, such as one to about seven carbon atoms. The hydrocarbyl may be methyl, ethyl, n-propyl, isopropyl, n-butyl, isobutyl, tert-butyl, a pentyl, a hexyl, a heptyl, phenyl, or benzyl. Typical substituents on substituted hydrocarbyl include nitro, amino, halide, cyano, carbonyl, carboxyl, hydroxyl, and alkoxy. A preferred substituent is halide, which may be chloride, bromide, or iodide. Preferably, the halide substituent is chloride.

Additionally, the substituted or unsubstituted alkoxy and substituted or unsubstituted amino typically have from one to about twenty five carbon atoms, more typically from one to about twelve carbon atoms, such as one to about six carbon atoms. Typical substituents on substituted alkoxy and substituted amine include nitro, amino, halide, cyano, carbonyl, carboxyl, hydroxyl, and alkoxy.

In one embodiment, the azole component is a 2-substituted benzimidazole, which has the following general structure (IX):

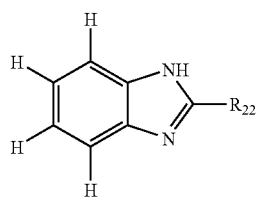

Structure (IX)

wherein $R_{22}$ is as defined in connection with structure (IV).

Exemplary substituted azoles include 2-(3,4-dichlorobenzyl)-benzimidazole; 2-bromobenzyl benzimidazole; 2-bromophenyl benzimidazole; 2-bromoethylphenyl benzimidazole; 2-chlorobenzyl benzimidazole; 2-chlorophenyl benzimidazole; and 2-chloroethylphenyl benzimidazole.

The organic compound comprising a nitrogen-containing functional group, i.e., amine or aromatic heterocycle comprising nitrogen, may be present in the composition at a concentration of at least 0.01% by weight (about 0.1 g/L). Typically, the concentration of the molecule that comprises at least one organic functional group that interacts with and protects copper surfaces is at most about 10% by weight (about 100 g/L). The organic compound may be present in the composition at a concentration up to the solubility limit, such that the concentration may be higher or lower than about 10% by weight. Accordingly, the nitrogen-containing organic compound may be added to the surface treating compositions of the present invention at a concentration between about 0.01% by weight (about 0.1 g/L) and about 10% by weight (about 100 g/L), preferably between about 0.1% (about 1 g/L) by weight and about 1.0% by weight (about 10 g/L). The concentration is typically at or above this minimum concentration to achieve adequate coverage of the substrate for corrosion protection. Typically, the concentration of the nitrogen-containing organic compound is at least about 1.0 g/L, more typically at least about 2.0 g/L. Accordingly, the concentration may be between about 0.1 g/L up to the solubility limit in the composition, typically between about 1.0 g/L and about 10 g/L, more typically between about 2.0 g/L and about 10 g/L, such as about 3 g/L.

In a preferred embodiment, the surface treating composition further comprises an organic compound comprising a sulfur-containing functional group. Organic compounds comprising sulfur-containing functional groups include thiols (mercaptans), disulfides, thioethers, thioaldehydes, and thioketones. Without being bound to a particular theory, it is thought that an electron pair from the sulfur atom forms a sulfur-precious metal bond, thereby self-assembling a protective organic film over the precious metal coating layer, wherein the film comprises a self-assembled monolayer comprising an organic molecule comprising the sulfur atom bonded to the precious metal surface. In one embodiment, the copper substrate is coated with a silver coating layer deposited by, for example, immersion displacement plating, and the sulfur atom present in the organic molecule forms a sulfur-silver bond. In one embodiment, the copper substrate is coated with a gold coating layer deposited by, for example, immersion displacement plating, and the sulfur atom present in the organic molecule forms a sulfur-gold bond. The sulfur containing compound typically comprises an organic component that enhances the effectiveness of the organic protective film by rendering the film more hydrophobic and thus more capable of repelling water and environmental humidity.

In one embodiment, the organic compound comprising a sulfur-containing functional group is a thiol. Thiols have the following general structure (X):

$$R_1\text{—S—H} \qquad \text{Structure (X)}$$

wherein $R_1$ is a hydrocarbyl (i.e., alkyl, alkenyl, alkynyl) having from one carbon atom to about 24 carbon atoms, an aryl having from about five to about fourteen carbon atoms, or an arylhydrocarbyl wherein the hydrocarbyl has from one carbon atom to about 24 carbon atoms and the aryl has from about five to about fourteen carbon atoms. The hydrocarbyl preferably comprises between about six carbon atoms and about 18 carbon atoms. The aryl preferably comprises between about four and about ten carbon atoms. The aryl may comprise one five-membered ring or one six-membered ring or a fused two-ring system in which the two-rings include a five-membered ring and a six-membered ring or two six-membered rings. The aryl and hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers.

In one embodiment, the $R_1$ of structure (X) is the hydrocarbyl, and the thiol is an alkyl thiol, an alkenyl thiol, or an alkynyl thiol. Exemplary such hydrocarbyl thiols applicable for use in the composition of the present invention include, singly or in combination, ethanethiol; 1-propanethiol; 2-propanethiol; 2-propene-1-thiol; 1-butanethiol; 2-butanethiol; 2-methyl-1-propanethiol; 2-methyl-2-propanethiol; 2-methyl-1-butanethiol; 1-pentanethiol; 2,2-dimethyl-1-propanethiol; 1-hexanethiol; 1,6-hexanedithiol; 1-heptanethiol; 2-ethylhexanethiol; 1-octanethiol; 1,8-octanedithiol;

1-nonanethiol; 1,9-nonanedithiol; 1-decanethiol; 1-adamantanethiol; 1,11-undecanedithiol; 1-undecanethiol; 1-dodecanethiol; tert-dodecylmercaptan; 1-tridecanethiol; 1-tetradecanethiol; 1-pentadecanethiol; 1-hexadecanethiol; 1-heptadecanethiol; 1-octadecanethiol; 1-nonadecanethiol; and 1-icosanethiol. In one preferred embodiment, the $R_1$ is hydrocarbyl, is not substituted with other groups, and is a straight-chained alkyl, since straight-chained alkyl better achieves a desirable densely packed self-assembled monolayer over the precious metal surface coating.

In another preferred embodiment, the $R_1$ comprises the aryl or the arylhydrocarbyl. Aryl and arylhydrocarbyl thiols also achieve highly hydrophobic, densely packed self-assembled monolayers over the precious metal surface coating. Exemplary aryl and arylhydrocarbyl thiols applicable for use in the composition of the present invention include, singly or in combination, benzenethiol; 2-methylbenzenethiol; 3-methylbenzenethiol; 4-methylbenzenethiol; 2-ethylbenzenethiol; 3-ethylbenzenethiol; 4-ethylbenzenethiol; 2-propylbenzenethiol; 3-propylbenzenethiol; 4-propylbenzenethiol; 2-tert-butylbenzenethiol; 4-tert-butylbenzenethiol; 4-pentylbenzenethiol; 4-hexylbenzenethiol; 4-heptylbenzenethiol; 4-octylbenzenethiol; 4-nonylbenzenethiol; 4-decylbenzenethiol; benzyl mercaptan; 2,4-xylenethiol, furfuryl mercaptan; 1-naphthalenethiol; 2-naphthalenethiol; and 4,4'-dimercaptobiphenyl.

In one embodiment, the organic compound comprising a sulfur-containing functional group is a disulfide. Disulfides can be formed by the oxidation of two thiols and can have the following structure (XI):

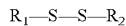

Structure (XI)

wherein $R_1$ and $R_2$ are each independently a hydrocarbyl (i.e., alkyl, alkenyl, alkynyl) having between one carbon atom and about 24 carbon atoms, an aryl having between about five and about fourteen carbon atoms, or an arylhydrocarbyl wherein the hydrocarbyl has from one carbon atom to about 24 carbon atoms and the aryl has from about five to about fourteen carbon atoms. The hydrocarbyl preferably comprises between about six carbon atoms and about 18 carbon atoms. The aryl preferably comprises between about four and about ten carbon atoms. The aryl may comprise one five-membered ring or six-membered ring or a fused two-ring system in which the two-rings include a five-membered ring and a six-membered ring or two six-membered rings. The aryl and hydrocarbyl may be substituted or unsubstituted. The aryl and hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers.

In one embodiment, the $R_1$ and $R_2$ are each hydrocarbyl, and the disulfide is a di-alkyl thiol, a di-alkenyl thiol, or a di-alkynyl thiol. Exemplary disulfides applicable for use in the composition of the present invention include, singly or in combination, diethyl disulfide, di-n-propyl disulfide, diisopropyl disulfide, diallyl disulfide, di-n-butyl disulfide, di-sec-butyl disulfide, diisobutyl disulfide, di-tert-butyl disulfide, di-n-pentyl disulfide, di-neopentyl disulfide, di-n-hexyl disulfide, di-n-heptyl disulfide, di-n-octyl disulfide, di-n-nonyl disulfide, di-n-decyl disulfide, di-n-undecyl disulfide, di-n-dodecyl disulfide, di-n-tridecyl disulfide, di-n-tetradecyl disulfide, di-n-pentadecyl disulfide, di-n-hexadecyl disulfide, di-n-heptadecyl disulfide, di-n-octadecyl disulfide, di-n-nonadecyl disulfide, and di-n-icosyl disulfide, among others. In one preferred embodiment, the $R_1$ and $R_2$ hydrocarbyls are not substituted with other groups and are straight-chained alkyls, since straight-chained alkyls better achieve a desirable densely packed self-assembled monolayer over the precious metal surface coating.

In another preferred embodiment, $R_1$ and $R_2$ are each the aryl or the arylhydrocarbyl. It is thought that the sulfur-sulfur bond may be broken more easily for aromatic disulfides, such that the sulfur atom is more easily made available for bonding to silver or gold. Aryl and arylhydrocarbyl disulfides also achieve highly hydrophobic, densely packed self-assembled monolayers over the precious metal surface coating. Exemplary aryl and arylhydrocarbyl disulfides applicable for use in the composition of the present invention include, singly or in combination, dibenzyl disulfide, dithienyl disulfide, and 2-naphthyl disulfide.

The organic molecule comprising at least one functional group that interacts with and protects precious metal surfaces may be added to the composition of the present invention at a concentration between about 0.01% by weight (about 0.1 g/L) and about 10% by weight (about 100 g/L), preferably between about 0.1% by weight (about 1.0 g/L) and about 1.0% by weight (about 10 g/L). The sulfur containing compound is added to the composition in at least 0.1 g/L to achieve adequate coverage and protection of the surface coating. The maximum concentration of about 100 g/L is an estimate based on the compound's solubility and therefore may be higher or lower than the stated amount depending upon the identity of the sulfur containing compound. In a preferred composition, the organic molecule comprising at least one functional group that interacts with and protects precious metal surfaces is 1-octadecanethiol added in a concentration between about 0.5 g/L and about 10.0 g/L, for example, about 5.0 g/L.

In an alternative embodiment, the nitrogen-containing functional group and the sulfur-containing functional group are located on the same molecule, thus making the molecule a multi-functional molecule. Stated another way, the organic compound comprising the nitrogen-containing functional group further comprises a sulfur-containing functional group.

In one embodiment, the multi-functional molecule comprises a functional group comprising nitrogen and a thiol. The nitrogen-containing functional group may be an amine or an aromatic heterocycle comprising nitrogen. In general, the multi-functional molecule comprises a hydrocarbyl linking group that links the nitrogen-containing functional group and the thiol through a hydrocarbyl chain and have a general structure (XII):

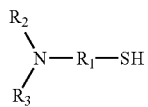

Structure (XII)

wherein $R_1$ is a hydrocarbyl (i.e., alkyl, alkenyl, alkynyl) having between one carbon atom and about 24 carbon atoms, an aryl having between about five and about fourteen carbon atoms, or an arylhydrocarbyl wherein the hydrocarbyl has from one carbon atom to about 24 carbon atoms and the aryl has from about five to about fourteen carbon atoms. The $R_2$ and $R_3$ are each independently, a carbon atom, a nitrogen atom, or a hydrogen atom. When the $R_2$ and $R_3$ are the carbon atom or the nitrogen atom, the atoms are typically part of a functional group. For example, when either or both $R_2$ and $R_3$ are carbon atoms, they may define a hydrocarbyl group (e.g., secondary and tertiary amines) or may be part of an aryl ring (e.g., heterocyclic aromatic rings comprising nitrogen, such as imidazole, benzimidazole, and others). When either or both $R_2$ and $R_3$ are nitrogen atoms, the nitrogen-containing functional group is typically part of an heterocyclic aromatic ring, such as indazole (1,2-benzodiazole), 1H-benzotriazole, and 2H-benzotriazole, among others.

The carbon chain of the $R_1$ hydrocarbyl may comprise between about one and about 24 carbon atoms. In embodiments wherein the nitrogen-containing functional group is an amine, the $R_1$ carbon chain more typically comprises between about six and about 24 carbon atoms, more typically between about 12 and about 18 carbon atoms. In embodiments wherein the nitrogen-containing functional group is an aromatic heterocycle comprising nitrogen, the $R_1$ hydrocarbyl linkage is typically shorter, such as between about one carbon atom and about six carbon atoms, more typically between about one carbon atom and about four carbon atoms. The carbon chain of the $R_1$ hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

In one embodiment, the multi-functional molecule defined by structure (XII) comprises an amine and a thiol. The amine may be a primary amine ($R_1$ is a hydrocarbyl and $R_2$ and $R_3$ are both hydrogen), a secondary amine ($R_1$ is a hydrocarbyl and one of $R_2$ and $R_3$ is a hydrocarbyl while the other of $R_2$ and $R_3$ is hydrogen), or a tertiary amine ($R_1$, $R_2$, and $R_3$ are each hydrocarbyl). Exemplary multi-functional molecules comprising an amine and a thiol include cysteine, methionine, 2-Aminoethanethiol(cysteamine), 3-aminopropanethiol, 4-aminobutanethiole, 5-aminopentanethiol, 6-aminohexanethiol, 8-aminooctanethiol, 8-aminooctanethiol, 10-aminodecanethiol, and 12-aminododecanethiol. The multi-functional groups comprising relatively long chain hydrocarbons may have the amino functionality at locations other than the opposite end of the hydrocarbon chain from the thiol group. For example, applicable aminododecanethiols include those in which the amino functional group is located at any of the carbons in the hydrocarbon chain.

In one embodiment, the multi-functional molecule defined by structure (XII) comprises an aromatic heterocycle comprising nitrogen and a thiol. In one embodiment, the nitrogen atom, $R_2$, and $R_3$ of structure (XII), and two other atoms form a 5-membered aromatic heterocyclic ring. The other two atoms in the 5-membered ring may be carbon atoms or nitrogen atoms. The 5-membered aromatic heterocyclic ring may be unfused (i.e., a pyrrole, an imidazole, a pyrazole, a triazole, or a tetrazole) or may be fused to a six-member ring (i.e., an isoindole, an indole, a benzimidazole, an indazole, a benzotriazole, a purine, or an imidazo[4,5-b]pyridine). See Table 1 above. The multi-functional molecule may have the general structure (XIII):

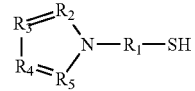

Structure (XIII)

wherein $R_1$ is hydrocarbyl (i.e., alkyl, alkenyl, alkynyl) and $R_2$, $R_3$, $R_4$, $R_5$ are nitrogen, sulfur, or carbon. The carbon chain of the $R_1$ hydrocarbyl may comprise between about one and about 24 carbon atoms, two and about 24 carbon atoms, typically between about six and about 24 carbon atoms, more typically between about 12 and about 18 carbon atoms. Any of the carbon chain of the hydrocarbyl, $R_2$, $R_3$, $R_4$, and $R_5$ may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

In another embodiment, the nitrogen atom, the $R_1$ and $R_2$ of structure (XII), and two other atom forms a 5-membered aromatic heterocyclic ring. Alternatively, the $R_1$ and $R_3$ of structure (XII), and two other atom forms a 5-membered aromatic heterocyclic ring. The two other atoms in the 5-membered ring may be carbon atoms or nitrogen atoms. The 5-membered aromatic heterocyclic ring may be unfused (i.e., a pyrrole, an imidazole, a pyrazole, a triazole, or a tetrazole) or may be fused to a six-member ring (i.e., an isoindole, an indole, a benzimidazole, an indazole, a benzotriazole, a purine, or an imidazo[4,5-b]pyridine). See Table 1 above. In this embodiment, the multi-functional molecule may have any of the general structures (XIVa) through (XIVd):

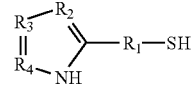

Structure (XIVa)

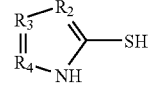

Structure (XIVb)

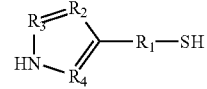

Structure (XIVc)

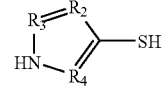

Structure (XIVd)

wherein $R_1$ is hydrocarbyl and $R_2$, $R_3$, and $R_4$ are nitrogen, sulfur, or carbon. The carbon chain of the hydrocarbyl may comprise between about one and about 24 carbon atoms, between about two and about 24 carbon atoms, typically between about six and about 24 carbon atoms, more typically between about 12 and about 18 carbon atoms. Any of the carbon chain of the hydrocarbyl, $R_2$, $R_3$, and $R_4$ may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ hydrocarbyl is not substituted with other groups, as straight-chained hydrocarbons better achieve desirable densely packed self-assembled monolayer on the silver and copper surfaces.

Exemplary multi-functional molecules comprising an aromatic heterocycle comprising nitrogen and a thiol for use in the anti-corrosion composition and for use in a protective film over immersion silver and copper surfaces include:

2-mercaptobenzimidazole; 2-mercapto-5-methylbenzimidazole; 2-mercapto-5-nitrobenzimidazole; 5-Amino-2-mercaptobenzimidazole; 5-Ethoxy-2-mercaptobenzimidazole; 5-(difluoromethoxy)-2-mercapto-1H-benzimidazole; 2-mercapto-1-methylimidazole; 1-Methyl-1H-benzimidazole-2-thiol; 1-[2-(Dimethylamino)ethyl]-1H-tetrazole-5-thiol, 1-(4-Hydroxyphenyl)-1H-tetrazole-5-thiol; 1-(2-methoxyphenyl)-4-(4-nitrophenyl)-1H-imidazole-2-thiol; 1-(2-methylphenyl)-4-(4-methylphenyl)-1H-imidazole-2-thiol; 4-Phenylthiazole-2-thiol; 1H-1,2,4-Triazole-3-thiol; 2-Thiazoline-2-thiol; 4-Amino-6-mercaptopyrazolo[3,4-d]pyrimidine; 3-Amino-1,2,4-triazole-5-thiol; 4-Amino-5-(4-pyridyl)-4H-1,2,4-triazole-3-thiol; 4-Amino-5-phenyl-4H-1,2,4-triazole-3-thiol; 5-amino-1,3,4-thiadiazole-2-thiol; 2-mercapto-5-methylamino-1,3,4-thiadiazole; 5-mercapto-1-methyltetrazole; 1-phenyl-1H-tetrazole-5-thiol; and other bath-compatible molecules having an azole and thiol functional groups.

In one embodiment, the multi-functional molecule comprises a nitrogen-containing functional group and a disulfide. This multi-functional molecule is substantially similar to the molecule comprising a functional group comprising nitrogen and the thiol, except that two thiols are bonded together through a disulfide linkage, —S—S—. Accordingly, the multi-functional molecule may have the following general structure (XV):

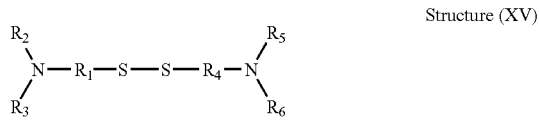

Structure (XV)

wherein $R_1$ and $R_4$ are hydrocarbyl (i.e., alkyl, alkenyl, alkynyl) having between one carbon atom and about 24 carbon atoms, an aryl having between about five and about fourteen carbon atoms, or an arylhydrocarbyl wherein the hydrocarbyl has from one carbon atom to about 24 carbon atoms and the aryl has from about five to about fourteen carbon atoms. The $R_2$, $R_3$, $R_5$, $R_6$ are each independently, a carbon atom, a nitrogen atom, or a hydrogen atom. When the $R_2$, $R_3$, $R_5$, $R_6$ are the carbon atom or the nitrogen atom, the atoms are typically part of a functional group. For example, when either or both $R_2$ and $R_3$ are carbon atoms, they may define a hydrocarbyl group (e.g., secondary and tertiary amines) or may be part of an aryl ring (e.g., heterocyclic aromatic rings comprising nitrogen, such as imidazole, benzimidazole, and others). When either or both $R_2$ and $R_3$ are nitrogen atoms, the nitrogen-containing functional group is typically part of an heterocyclic aromatic rings, such as indazole(1,2-benzodiazole), 1H-benzotriazole, and 2H-benzotriazole, among others.

The carbon chain of the hydrocarbyl may comprise between about one and about 24 carbon atoms. In embodiments wherein the nitrogen-containing functional group is an amine, the carbon chain more typically comprises between about six and about 24 carbon atoms, more typically between about 12 and about 18 carbon atoms. In embodiments wherein the nitrogen-containing functional group is an aromatic heterocycle comprising nitrogen, the hydrocarbyl linkage is typically shorter, such as between about one carbon atom and about six carbon atoms, more typically between about one carbon atom and about four carbon atoms. The carbon chain of the hydrocarbyl may be substituted or unsubstituted. Typical substituents include short carbon chain branching alkyl groups, typically having from one to four carbon atoms, i.e., methyl, ethyl, propyl, and butyl substituents and aromatic groups such as phenyl, naphthenyl, and aromatic heterocycles comprising nitrogen, oxygen, and sulfur. Other substituents include amines, thiols, carboxylates, phosphates, phosphonates, sulfates, sulfonates, halogen, hydroxyl, alkoxy, aryloxy, protected hydroxy, keto, acyl, acyloxy, nitro, cyano, esters, and ethers. In one preferred embodiment, the $R_1$ and $R_2$ hydrocarbyls are not substituted with other groups, as straight-chained hydrocarbons better achieve desirable densely packed self-assembled monolayer on the silver and copper surfaces.

Exemplary molecules comprising a functional group comprising nitrogen and a disulfide include 2,2'-Dipyridyl disulfide, 4,4'-Dipyridyl disulfide 2-aminophenyl disulfide, 4-aminophenyl disulfide, cystamine (commonly available as the dihydrochloride salt), bis(2-aminoethyl)disulfide, bis(3-aminopropyl)disulfide, bis(4-aminobutyl)disulfide, bis(5-aminopentyl)disulfide, bis(6-aminohexyl)disulfide, bis(7-aminoheptyl)disulfide, bis(8-aminooctyl)disulfide, bis(10-aminodecyl)disulfide, and disulfides with longer carbon chains.

The multi-functional molecule may be present in the anti-corrosion composition at a typical concentration of about 3 g/L. The concentration is typically at this minimum concentration to achieve adequate coverage of the substrate for corrosion protection. Typically, the concentration of the multi-functional molecule is at least about 0.01 g/L, more typically at least about 0.1 g/L, even more typically at least about 1 g/L. The multi-functional molecule may be present in the anti-corrosion composition at a concentration up to its solubility limit, typically at most about 100 g/L. Typically, the concentration of the multi-functional molecule is less than about 10 g/L, more typically less than about 6 g/L. Accordingly, the concentration of the multi-functional molecule may be between about 0.1 g/L and about 10 g/L, typically between about 1 g/L and about 6 g/L, such as in one embodiment about 3 g/L.

In one embodiment, the above-described phosphorus oxide compounds, organic compounds comprising nitrogen-containing functional groups (amines and aromatic heterocycles comprising nitrogen), and optionally, the organic compounds comprising sulfur-containing functional groups (thiols and disulfides) are dissolved in an organic solvent system. The solvent preferably has a low surface tension so that the composition can adequately cover the surface of the electronic connector and wet pores which can exist in the precious metal overlayer and base metal underlayer. Adequate wetting of the pores in these surface metallic layers is important to the efficacy of the composition of the invention. That is, adequate wetting of the pores allows the additives in the surface treating composition to penetrate into the pores and react with base metal oxides and the surface of the copper or copper alloy substrates. Moreover, the solvent is preferably a hydrophobic solvent such that it can adequately dissolve the hydrophobic components of the surface treating composition, in particular long hydrocarbon chain n-alkyl phosphonic acids.

Applicable solvents preferably have a surface tension below about 50 dynes/cm as measured at 25° C. (Unit conversion: 1 dyne/cm=1 nN/m; Surface tension standard test ASTM D971.) Preferably, the surface tension of the solvent is below about 45 dynes/cm as measured at 25° C., more preferably, the surface tension of the solvent is below about 40 dynes/cm as measured at 25° C., such as below about 35 dynes/cm as measured at 25° C. Low surface tension solvents are advantageous both from a solubility standpoint and a wetting standpoint. Low surface tension solvents allow the surface treating composition of the present invention to penetrate into any pores that may be present on the protective metallic surface coating. Preferred solvents include ISOPAR® solvents, naphthenic oils, alcohols such as 2-octanol, and water with added surfactants.

A class of solvents having low surface tension is paraffinic and isoparaffinic mineral oil solvents sold under the trade name ISOPAR® (Exxon Mobil Corporation, Fairfax, Va.). Applicable ISOPAR solvents include ISOPAR-C, ISOPAR-E, ISOPAR-G, ISOPAR-H, ISOPAR-K, ISOPAR-L, ISOPAR-M, and ISOPAR-V. All of these ISOPAR® solvents have surface tensions below 30 dynes/cm as measured at 25° C.

Another class of low surface tension solvents is naphthenic oils, such as those sold under the trade name RENOIL (Renkert Oil, Elverson, Pa.). Naphthenic oils are characterized by highly saturated cycloalkanes. Applicable RENOIL solvents include 40-S, 60B, 100HT, 200-S, 535, 775-S, 2000-S, and 3710.

Additional applicable low surface tension solvents include alcohols. Alcohols tend to have low surface tensions such that they may be used a primary solvent. Alcohols lower the surface tension of water when used as a supplemental solvent in aqueous-based solvent systems. Ethanol and isopropanol, for example, have surface tensions of about 22 dynes dynes/cm as measured at 20° C.

Since the surface treatment process of the present invention may occur at elevated temperatures, the alcohol is preferably a low volatility, high boiling alcohol, preferably having a boiling point of at least about 90° C., and preferably at least about 110° C., even more preferably at least about 150° C. Exemplary high boiling point alcohols for use in the OSP compositions of the present invention include those having three or more carbon atoms, such as n-propanol, isopropanol, 1-butanol, 2-butanol, tert-butanol, iso-butanol, 1-pentanol, 2-pentanol, other pentanols, 1-hexanol, other hexanols, heptanols, 1-octanol, 2-octanol, and other octanols, 1-decanol and other decanols, phenol, benzyl alcohol, furfuryl alcohol, and tetrahydrofurfuryl alcohol. Preferably, the alcohol has four or more carbon atoms, including 1-butanol, 2-butanol, tert-butanol, iso-butanol, 1-pentanol, 2-pentanol, other pentanols, 1-hexanol, other hexanols, heptanols, 1-octanol, 2-octanol, and other octanols, 1-decanol and other decanols, phenol, benzyl alcohol, furfuryl alcohol, and tetrahydrofurfuryl alcohol.

In some embodiments, the boiling point characteristics of the alcohol are not narrowly critical, and relatively volatile alcohols may be used. Exemplary alcohols for use in the surface treating compositions of the present invention include diols, triols, and higher polyols. Suitable alcohols include ethanol, n-propanol, isopropanol, 1-butanol, 2-butanol, tert-butanol, iso-butanol, 1-pentanol, 2-pentanol, other pentanols, 1-hexanol, other hexanols, heptanols, 1-octanol, 2-octanol, and other octanols, 1-decanol and other decanols, phenol, benzyl alcohol, ethylene glycol, propane-1,2-diol, butane-1,2-diol, butane-1,3-diol, butane-1,4-diol, propane-1,3-diol, hexane-1,4-diol hexane-1,5-diol, hexane-1,6-diol, 2-methoxyethanol, 2-ethoxyethanol, 2-propoxyethanol, 2-butoxyethanol, 1-methoxy-2-propanol, 3-methoxy-1-propanol, 3-ethoxy-1-propanol, etc. Then there are unsaturated diols, such as butene-diol, hexene-diol, and acetylenics such as butyne diol. A suitable triol is glycerol. Additional alcohols include triethylene glycol, diethylene glycol, diethylene glycol methyl ether, triethylene glycol monomethyl ether, triethylene glycol dimethyl ether, propylene glycol, dipropylene glycol, allyl alcohol, furfuryl alcohol, and tetrahydrofurfuryl alcohol.

In an alternative embodiment, the low surface tension solvent system comprises water and an alcohol selected from those listed above as a supplemental solvent. Alcohol may be used to enhance the solubility of the organic molecules and lower the surface tension of the solvent system to below about 50 dynes/cm as measured at 25° C., while the use of water as a primary solvent is advantageous from both cost and environmental perspectives. Moreover, it has been observed that the surface treating composition of the present invention functions well for preserving the solderability of copper surfaces even when processing drags a significant portion of water into the treatment composition. It has been observed that as much as 1 volume equivalent of water does not adversely affect the quality of the surface treatment composition. Stated another way, an initial solution of 1 liter may be diluted with water to 2 liters total volume and the composition remains effective in treating copper surfaces. The alcohol may be present in the composition at an initial concentration of at least about 10 mL/L. Typically, the concentration of the alcohol is at least about 100 mL/L, more typically at least about 150 mL/L. The alcohol may be present in the composition at a concentration up to its solubility limit in water. It is within the scope of the invention to employ solvent systems comprised entirely of alcohol. In aqueous solvent systems wherein the alcohol is a supplementary solvent, the concentration of the alcohol may be as much as about 750 mL/L, about 650 mL/L, or less, such as about 600 mL/L or about 500 mL/L, more typically less than about 200 mL/L. Accordingly, the alcohol concentration may be between about 10 mL/L and about 750 mL/L, typically between about 150 mL/L and about 500 mL/L.

In yet another embodiment, a surfactant may be added to an aqueous-based solvent system. Surfactants accomplish relatively large aqueous surface tension reduction in low concentrations and additionally enhance the wettability of the copper and other metal surfaces. The surfactant may be cationic, anionic, non-ionic, or zwitterionic. A particular surfactant may be used alone or in combination with other surfactants. One class of surfactants comprises a hydrophilic head group and a hydrophobic tail. Hydrophilic head groups associated with anionic surfactants include carboxylate, sulfonate, sulfate, phosphate, and phosphonate. Hydrophilic head groups associated with cationic surfactants include quaternary amine, sulfonium, and phosphonium. Quaternary amines include quaternary ammonium, pyridinium, bipyridinium, and imidazolium. Hydrophilic head groups associated with non-ionic surfactants include alcohol and amide. Hydrophilic head groups associated with zwitterionic surfactants include betaine. The hydrophobic tail typically comprises a hydrocarbon chain. The hydrocarbon chain typically comprises between about six and about 24 carbon atoms, more typically between about eight to about 16 carbon atoms.

Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, and sulfosuccinates. Anionic surfactants include any sulfate ester, such as those sold under the trade name Genapol (from Clariant, including Genapol LRO liquid, Genapol LRO paste, Genapol NH, Genapol LSA/LRA, Genapol LSS/S28, Genapol LST 40, Genapol XRO, etc.), and Triton (from Dow Chemical, including Triton QS-15 and Triton W-30). Anionic sulfate-esters include: sodium lauryl sulfate, sodium laureth sulfate (1 EO), sodium laureth sulfate (2 EO), sodium laureth, sodium laureth sulfate (3 EO), ammonium lauryl sulfate, ammonium laureth sulfate, TEA-lauryl sulfate, TEA-laureth sulfate, MEA-lauryl sulfate, MEA-laureth sulfate, potassium lauryl sulfate, potassium laureth sulfate, sodium decyl sulfate, sodium octyl/decyl sulfate, sodium 2-ethylhexyl sulfate, sodium octyl sulfate, sodium nonoxynol-4 sulfate, sodium nonoxynol-6 sulfate, sodium cumene sulfate, ammonium nonoxynol-6 sulfate, and polyether sulfates. Also applicable are sulfonate esters such as sodium α-olefin sulfonate, ammonium xylene sulfonate, sodium xylene sulfonate, sodium toluene sulfonate, dodecyl benzene sulfonate, and lignosulfonates; sulfosuccinate surfactants such as disodium lauryl sulfosuccinate, disodium laureth sulfosuccinate. Still other anionic surfactants include sodium cocoyl isethionate, lauryl phosphate, any of the ULTRAPHOS series of phosphate esters, Cyastat® 609 (N,N-Bis(2-hydroxyethyl)-N-(3'-Dodecyloxy-2'-Hydroxypropyl)Methyl Ammonium Methosulfate) and Cyastat® LS ((3-Lauramidopropyl)trimethylammonium methylsulfate), available from Cytec Industries. Additional phosphate esters include Triton H-55, Triton H-66, Triton QS-44, and Triton XQS-20, available from Dow Chemical.

Exemplary cationic surfactants include quaternary ammonium salts such as dodecyl trimethyl ammonium chloride, cetyl trimethyl ammonium salts of bromide and chloride, hexadecyl trimethyl ammonium salts of bromide and chloride, alkyl dimethyl benzyl ammonium salts of chloride and bromide, and the like. In this regard, surfactants such as Lodyne 106A (Fluoroalkyl Ammonium Chloride Cationic Surfactant 28-30%) and Ammonyx 4002 (Octadecyl dimethyl benzyl ammonium chloride Cationic Surfactant) are particularly preferred.

In a preferred embodiment, the surfactant is non-ionic. A class of non-ionic surfactants includes those comprising polyether groups, based on, for example, ethylene oxide (EO) repeat units and/or propylene oxide (PO) repeat units. These surfactants are typically non-ionic. Surfactants having a polyether chain may comprise between about 1 and about 36 EO repeat units, between about 1 and about 36 PO repeat units, or a combination of between about 1 and about 36 EO repeat units and PO repeat units. More typically, the polyether chain comprises between about 2 and about 24 EO repeat units, between about 2 and about 24 PO repeat units, or a combination of between about 2 and about 24 EO repeat units and PO repeat units. Even more typically, the polyether chain comprises between about 6 and about 15 EO repeat units, between about 6 and about 15 PO repeat units, or a combination of between about 6 and about 15 EO repeat units and PO repeat units. These surfactants may comprise blocks of EO repeat units and PO repeat units, for example, a block of EO repeat units encompassed by two blocks of PO repeat units or a block of PO repeat units encompassed by two blocks of EO repeat units. Another class of polyether surfactants comprises alternating PO and EO repeat units. Within these classes of surfactants are the polyethylene glycols, polypropylene glycols, and the polypropylene glycol/polyethylene glycols.

Yet another class of non-ionic surfactants comprises EO, PO, or EO/PO repeat units built upon an alcohol or phenol base group, such as glycerol ethers, butanol ethers, pentanol ethers, hexanol ethers, heptanol ethers, octanol ethers, nonanol ethers, decanol ethers, dodecanol ethers, tetradecanol ethers, phenol ethers, alkyl substituted phenol ethers, α-naphthol ethers, and β-naphthol ethers. With regard to the alkyl substituted phenol ethers, the phenol group is substituted with a hydrocarbon chain having between about 1 and about 10 carbon atoms, such as about 8 (octylphenol) or about 9 carbon atoms (nonylphenol). The polyether chain may comprise between about 1 and about 24 EO repeat units, between about 1 and about 24 PO repeat units, or a combination of between about 1 and about 24 EO and PO repeat units. More typically, the polyether chain comprises between about 8 and about 16 EO repeat units, between about 8 and about 16 PO repeat units, or a combination of between about 8 and about 16 EO and PO repeat units. Even more typically, the polyether chain comprises about 9, about 10, about 11, or about 12 EO repeat units; about 9, about 10, about 11, or about 12 PO repeat units; or a combination of about 9, about 10, about 11, or about 12 EO repeat units and PO repeat units.

An exemplary β-naphthol derivative non-ionic surfactant is Lugalvan BNO12 which is a β-naphtholethoxylate having 12 ethylene oxide monomer units bonded to the naphthol hydroxyl group. A similar surfactant is Polymax NPA-15, which is a polyethoxylated nonylphenol. Polyethoxylated nonylphenols are also sold under the Tergitol® trade name by Dow Chemical, and include Tergitol® NP-4, Tergitol® NP-6, Tergitol® NP-7, Tergitol® NP-8, Tergitol® NP-9, Tergitol® NP-10, Tergitol® NP-11, Tergitol® NP-12, Tergitol® NP-13, Tergitol® NP-15, and Tergitol® NP-30. Another surfactant is Triton®-X100 nonionic surfactant, which is an octylphenol ethoxylate, typically having around 9 or 10 EO repeat units. Additional commercially available non-ionic surfactants include the Pluronic® series of surfactants, available from BASF. Pluronic® surfactants include the P series of EO/PO block copolymers, including P65, P84, P85, P103, P104, P105, and P123, available from BASF; the F series of EO/PO block copolymers, including F108, F127, F38, F68, F77, F87, F88, F98, available from BASF; and the L series of EO/PO block copolymers, including L10, L101, L121, L31, L35, L44, L61, L62, L64, L81, and L92, available from BASF. Another class of nonionic polyether surfactants includes low foaming surfactants, such as the Triton CF series, including Triton CF-10, Triton CF-21, Triton CF-32, Triton CF-76, Triton CF-87 and the Triton DF series, including Triton DF-12, Triton DF-16, Triton DF-18, and Triton DF-20.

Additional commercially available non-ionic surfactants include water soluble, ethoxylated nonionic fluorosurfactants available from DuPont and sold under the trade name Zonyl®, including Zonyl® FSN (Telomar B Monoether with Polyethylene Glycol nonionic surfactant), Zonyl® FSN-100, Zonyl® FS-300, Zonyl® FS-500, Zonyl® FS-510, Zonyl® FS-610, Zonyl® FSP, and Zonyl® UR. Other non-ionic surfactants include the amine condensates, such as cocoamide DEA and cocoamide MEA, sold under the trade name ULTRAFAX. Other classes of nonionic surfactants include acid ethoxylated fatty acids (polyethoxy-esters) comprising a fatty acid esterified with a polyether group typically comprising between about 1 and about 60 EO repeat units, such as between about 1 and about 40 EO repeat units, such as about 25 EO repeat units, 30 EO repeat units, 36 EO repeat units, or 40 EO repeat units. Glycerol esters comprise one, two, or three fatty acid groups on a glycerol base. Exemplary such surfactants include Cremophor® EL available from BASF and the Emulsogen EL series, including Emulsogen EL, Emulsogen EL-250, Emulsogen EL-300, and Emulsogen EL-400, available from Clariant. Yet another class of non-ionic surfactants includes alkyl polyglucosides, such as Triton BG-10 and Triton CG-110, available from Dow Chemical.

Typically, the surfactant or surfactant blend may be added to aqueous concentration at relatively low concentrations, such as from about 0.01 g/L to about 10 g/L and provide effective wetting and surface tension reduction. In the context of the present invention, the total concentration of the surfactants in the surfactant blend is typically higher than is found conventionally, such as at least about 10 g/L, at least about 15 g/L, at least about 20 g/L, and even at least about 25 g/L. The surfactant concentration may be limited to less than about 150 g/L, or preferably less than about 100 g/L to avoid foaming. Typically, the surfactant concentration may be between about 10 g/L and about 150 g/L, such as from about 20 g/L and about 100 g/L, and even more typically between about 20 g/L and about 80 g/L, such as between about 35 g/L and about 55 g/L.

The aqueous composition of the present invention preferably has a pH between about 1.0 and about 12.0, typically between about 7.0 and about 11.0. The composition is preferably alkaline because in alkaline solution, the formation of the protective organic coating is more rapid than its formation in acidic solution. Alkaline adjustment may be accomplished using alkaline pH adjusting agents, such as sodium hydroxide, potassium hydroxide, hydroxides of quaternary amines, such as tetramethylammonium hydroxide, tetraethylammonium hydroxide, and the like. Typically, the concentration of the alkaline pH adjuster is sufficient to achieve the desired alkaline pH and may be between about 0.01 g/L and about 10.0 g/L, typically between about 0.01 g/L and about 2.0 g/L, more typically between about 0.1 g/L and about 0.5 g/L.

In one particularly preferred embodiment, the composition contains no alkali metal hydroxide, and only an alternative agent such as sodium tetra borate is used for pH adjustment.

Embodiments of the invention are shown in the following Table 2:

TABLE 2

Embodiments of the Invention

| | Concentrations (wt. %) | | | | |
|---|---|---|---|---|---|
| | A | B | C | D | E |
| Composition 1 | | | | | |
| Hot water | 93.13 | 48.6 | 57.6 | 84.45 | 93.31 |
| Triton BG-10 | 4 | 10.3 | 15 | 4 | 2.98 |
| Emulsogen EL | 0.28 | 2.8 | 2 | 5 | 1.28 |
| 1-octadecathiol | 0.8 | 3.5 | 1.5 | 3 | 0.64 |
| Genapol LRO Liquid | 0.09 | 33 | 21 | 0.05 | 0.09 |
| Octylphosphonic acid | 1.2 | 1 | 2 | 3 | 1.2 |
| Benzotriazole | 0.5 | 0.8 | 0.9 | 0.5 | 0.5 |
| Composition 2 | | | | | |
| Hot water | 93.13 | 48.6 | 57.6 | 84.45 | 48.5 |
| Triton DF-20 | 4 | 10.3 | 15 | 4 | 6.7 |
| Emulsogen EL | 0.28 | 2.8 | 2 | 5 | 3.8 |
| 1-octadecathiol | 0.8 | 3.5 | 1.5 | 3 | 5 |
| Genapol LRO Liquid | 0.09 | 33 | 21 | 0.05 | 12 |
| Octylphosphonic acid | 1.2 | 1 | 2 | 3 | 12 |
| Benzotriazole | 0.5 | 0.8 | 0.9 | 0.5 | 12 |

TABLE 2-continued

Embodiments of the Invention

| | Concentrations (wt. %) | | | | |
|---|---|---|---|---|---|
| | A | B | C | D | E |
| Composition 3 | | | | | |
| Hot water | 93.41 | 51.4 | 59.6 | 89.45 | 52.3 |
| Triton CF-21 | 4 | 10.3 | 15 | 4 | 6.7 |
| 1-octadecathiol | 0.8 | 3.5 | 1.5 | 3 | 5 |
| Genapol LRO Liquid | 0.09 | 33 | 21 | 0.05 | 12 |
| Octylphosphonic acid | 1.2 | 1 | 2 | 3 | 12 |
| Benzotriazole | 0.5 | 0.8 | 0.9 | 0.5 | 12 |
| Composition 4 | | | | | |
| Hot water | 93.22 | 81.6 | 78.6 | 84.5 | 60.5 |
| Triton CF-32 | 4 | 10.3 | 15 | 4 | 6.7 |
| Emulsogen EL | 0.28 | 2.8 | 2 | 5 | 3.8 |
| 1-octadecathiol | 0.8 | 3.5 | 1.5 | 3 | 5 |
| Octylphosphonic acid | 1.2 | 1 | 2 | 3 | 12 |
| Benzotriazole | 0.5 | 0.8 | 0.9 | 0.5 | 12 |
| Composition 5 | | | | | |
| Hot water | 93.22 | 81.6 | 78.6 | 84.5 | 60.5 |
| Triton H-55 | 4 | 10.3 | 15 | 4 | 6.7 |
| Emulsogen EL | 0.28 | 2.8 | 2 | 5 | 3.8 |
| 1-octadecathiol | 0.8 | 3.5 | 1.5 | 3 | 5 |
| Octylphosphonic acid | 1.2 | 1 | 2 | 3 | 12 |
| Benzotriazole | 0.5 | 0.8 | 0.9 | 0.5 | 12 |
| Composition 6 | | | | | |
| Hot water | 93.22 | 81.6 | 78.6 | 84.5 | 60.5 |
| Triton QS-15 | 4 | 10.3 | 15 | 4 | 6.7 |
| Emulsogen EL | 0.28 | 2.8 | 2 | 5 | 3.8 |
| 1-octadecathiol | 0.8 | 3.5 | 1.5 | 3 | 5 |
| Octylphosphonic acid | 1.2 | 1 | 2 | 3 | 12 |
| Benzotriazole | 0.5 | 0.8 | 0.9 | 0.5 | 12 |

Electronic devices applicable for surface treatment with the compositions of the present invention are typically copper or copper alloy wires and electronic connectors. Additional substrates include copper circuitry in printed circuit boards. These copper or copper alloy wires, connectors, and copper circuitry are typically coated with a metallic surface coating. The metallic surface coating may be electrolytically plated onto the copper or copper alloy substrate, deposited by electroless deposition, or deposited by immersion plating. The metallic surface coating typically may comprise one, two, or more than two metallic layers. In embodiments comprising two or more than two metallic layers, the first layer may be described as an underlayer and is typically a base metal layer deposited on a surface of the copper or copper alloy substrate. A metallic layer deposited on a surface of the base metal layer may be referred to as an overlayer. The overlayer is typically a precious metal layer deposited on a surface of the base metal layer. The base metal underlayer may comprise one or more than one base metal, present either as a base metal alloy layer or as two distinct base metal layers. Similarly, the precious metal overlayer may comprise one precious metal, more than one precious metal, or an alloy of a precious metal and a base metal. The precious metal layer may comprise a precious metal alloy layer or two distinct precious metal layers. In those embodiments where the metallic surface coating comprises only one layer, the single layer may comprise either a base metal underlayer or a precious metal layer. The base metal underlayer may comprise a pure base metal coating or a base metal alloy coating with another base metal or a precious metal. Similarly, the precious metal overlayer can comprise a pure precious metal coating or a precious metal alloy coating with another precious metal or a base metal.

Base metals applicable for the underlayer include nickel, tin, zinc, chromium, titanium, aluminum, tantalum, zirconium, hafnium, molybdenum, tungsten, alloys of these metals with each other, and other alloys of each of these metals. Applicable alloys of nickel include nickel-aluminum-titanium, nickel-copper, nickel-copper-aluminum, nickel-chromium-iron, nickel-chromium-cobalt, and nickel-chromium-molybdenum. Applicable alloys of tin include tin-lead; tin-copper; tin-silver; tin-silver-copper; tin-silver-copper-antimony; tin-zinc; tin-zinc-bismuth; tin-antimony; tin-indium-silver-bismuth; tin-bismuth-silver; tin-bismuth; and tin-indium. Base metals may be alloyed with precious metals, typically palladium.

Precious metals applicable for the overlayer include gold, silver, platinum, palladium, and alloys of any of these precious metals with another precious metal. A preferred precious metal coating is gold. An example of a precious metal alloy may be an alloy of gold and palladium. The precious metal overlayer may be as thick as about 1 micron, 2 microns, or more than 2 microns, such as 3 microns, 4 microns, or even 5 microns. Thicker precious metal overlayers may be used in harsh environments, such as areas of high pollution. Thicker precious metal overlays add to the cost of the metallic surface coating. Accordingly, the precious metal overlayer may be thinner than those thicknesses described above, such as about 0.5 micron, about 0.25 micron, or even about 0.1 micron. Accordingly, the precious metal overlayer may be between about 0.1 micron and about 5 microns, preferably between about 0.1 micron and about 1 micron, even more preferably between about 0.25 micron and about 1 micron.

It is known that gold is hardened by the nickel underlayer, so a connector finish comprising a nickel underlayer and a gold overlayer is commonly referred to as a "hardened" or "hard" gold finish. The nickel underlayer can be plated by commercially available chemistries. For electrolytic nickel plating, the SULFAMEX® chemistries available from Enthone Inc. may be used, such as SULFAMEX® MLS. The gold overlayer can be plated by commercially available chemistries, such as the AUTRONEX® chemistries applicable to plating nickel-hardened gold, also available from Enthone Inc. In the context of metallic surface coatings over copper circuitry in PCB, the nickel layer is typically deposited by electroless deposition, followed by immersion gold. In this context, the final finish is referred to as Electroless Nickel-Immersion Gold, or ENIG. The nickel and gold layers may be plated by commercially available chemistries.

In one embodiment, the electronic device comprises a copper or copper alloy substrate coated with a metallic surface coating comprising a base metal layer comprising nickel or nickel alloy. In this embodiment, the metallic surface coating may be surface treated with a composition comprising a phosphorus oxide compound and an aromatic heterocycle comprising nitrogen. Accordingly, application of the surface treating composition to the metallic surface coating using ISOPAR® as the solvent, for example, allows the aromatic heterocycle comprising nitrogen, which may be benzotriazole for example, to penetrate into pores which may be present in the nickel layer. The aromatic heterocycle can react with the copper or copper alloy substrate and form a protective film over the copper or copper alloy substrate and fill in pores in the nickel layer. Further, the phosphorus oxide compound can form a protective organic film over the nickel layer.

In another embodiment, the electronic device comprises a copper or copper alloy substrate coated with a metallic surface coating comprising a base metal underlayer comprising nickel or nickel alloy and a precious metal overlayer comprising gold or gold alloy. In this embodiment, the metallic surface coating may be surface treated with a composition comprising a phosphorus oxide compound and an aromatic heterocycle comprising nitrogen. Accordingly, application of the surface treating composition to the metallic surface coating using ISOPAR® as the solvent, for example, allows the aromatic heterocycle comprising nitrogen, which may be benzotriazole for example, to penetrate into pores which may be present in the nickel layer. The aromatic heterocycle can react with the copper or copper alloy substrate and form a protective film over the copper or copper alloy substrate and fill in pores in the nickel layer. Further, the phosphorus oxide compound can form a protective organic film over the nickel layer and fill in pores that may be present in the gold overlayer. This embodiment is exemplified in FIG. 3.

Figure 5:
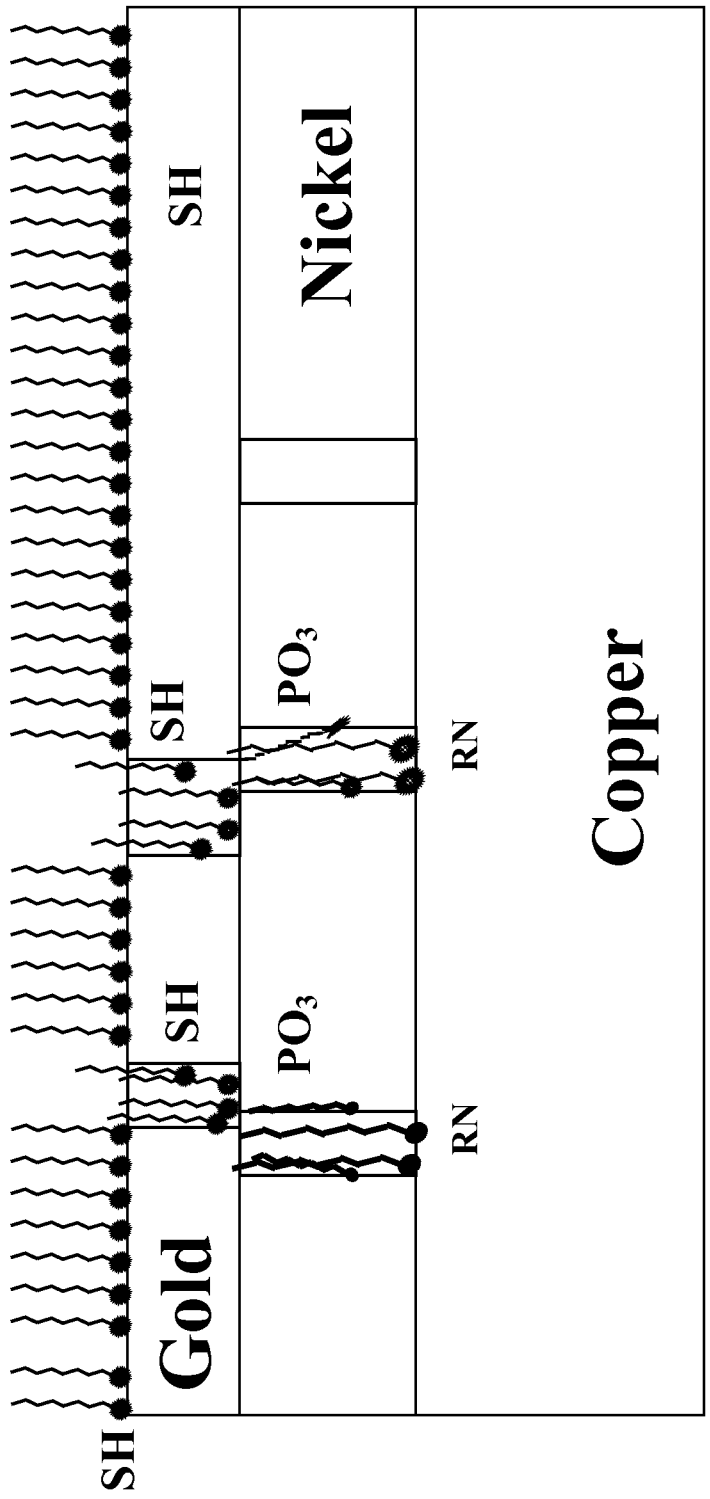
FIG. 5 is a depiction of a phosphorus oxide compound forming a protective film over a nickel underlayer by reacting with nickel oxide which may be present on the surface of the nickel underlayer, an aromatic heterocycle comprising nitrogen forming a protective film over a copper or copper alloy substrate by reacting with surface copper, and an alkyl thiol forming a protective film over a gold overlayer by reacting with surface gold. The phosphorus oxide compound further fills in pores in the gold overlayer and the aromatic heterocycle comprising nitrogen fills in pores in the nickel underlayer.

In yet another embodiment, the electronic device comprises a copper or copper alloy substrate coated with a metallic surface coating comprising a base metal underlayer comprising nickel or nickel alloy and a precious metal overlayer comprising gold or gold alloy. In this embodiment, the metallic surface coating is surface treated with a composition preferably comprising a phosphorus oxide compound, an organic compound comprising a nitrogen-containing functional group, such as amine or aromatic heterocycle comprising nitrogen, and an organic compound comprising a sulfur-containing functional group, such as an alkyl thiol or disulfide. The phosphorus oxide compound and organic compound comprising a nitrogen-containing functional group (amine or aromatic heterocycle comprising nitrogen) act to protect the electronic device as explained in the prior embodiment. Addition of the organic compound comprising a sulfur-containing functional group (alkyl thiol or disulfide) provides a further means of protecting the electronic device. The alkyl thiol reacts with and forms a protective film over the gold overlayer. Moreover, alkyl thiol can penetrate into pores which may be present in the nickel underlayer to react with and form a protective film over the copper or copper alloy substrate and fill in pores in the nickel underlayer. This embodiment is exemplified in FIG. 5.

In yet another embodiment, the precious metal coating comprises silver. The silver coating layer may be deposited on the copper substrate by an immersion-plated silver coating method known in the art. For example, the method of coating a copper substrate with immersion-plated silver described in U.S. Pub. No. 2006/0024430, herein incorporated by reference in its entirety, is applicable. Commercially available chemistries for immersion silver coating include AlphaSTAR®, available from Enthone Inc. (West Haven, Conn.).

Other metallic surface compositions that may be protected using the surface treating composition of the present invention include Cu—Ni—Pd—Au—Sn, Cu—Ni—Pd—Au—Sn, Cu—Ni—Sn, and Cu—Ag.

Another aspect of the present invention is directed to a method of enhancing the corrosion resistance of a solderable copper substrate having a precious metal coating on a surface thereof The surface treating composition of the present invention can be applied to the electronic device by dipping, flooding, or spray immersion, provided that the application method sufficiently wets the surface of the electronic device for a sufficient time for the additives to penetrate into the pores which may be present in the metallic surface coating and form a protective film over the coating.

The duration of exposure is not narrowly critical to the efficacy of the invention and may depend in part on engineering aspects of the process. Typical exposure times may be as little as about 1 second to as long as about 10 minutes, more typically between about 5 seconds and about 360 seconds. In practice, the exposure time may be between about 60 seconds and about 300 seconds, such as between about 120 and about 300 seconds, or, in some embodiments, may be as short as between about 15 seconds and about 60 seconds, such as between about 30 seconds and about 60 seconds. In view of these relatively short exposure times, the method of the present invention achieves rapid substrate coating. The temperature of the surface treating composition may vary between about 20° C. up to about 75° C., typically between about 25° C. and about 55° C., such as between about 45° C. and about 55° C. Exposure to the surface treating composition may be enhanced with scrubbing, brushing, squeegeeing, agitation, and stirring. In particular, agitation has been shown to be an effective means of enhancing the ability of the composition to apply a protective organic coating to the substrate. The agitation may be vigorous. After exposing the substrate to the surface treating composition, the substrate may be rinsed, typically with deionized water for between about 10 seconds to about 2 minutes.

The molecules interact with and form a protective organic film over the copper and precious metal surfaces by self-assembled adsorption. Accordingly, the molecules self-assemble into a monolayer on the various metal surfaces. Accordingly, the protective organic film is a relatively dense, hydrophobic film that can provide enhanced protection against atmospheric moisture, which in turn, enhances the immersion silver coating's resistance to corrosion and sulfidation.

The protective organic film of the present invention may be additionally characterized by high thermal stability, particularly to temperatures commonly reached during lead-free reflow. The protective organic coatings of the present invention can better withstand reflow temperatures compared to conventional organic coatings (such as OSP) as shown by differential scanning calorimetry and thermogravimetric analysis. For example, a protective organic coating is stable at temperatures as high as about 254° C., while only 5% of the film is lost at temperatures as high as 274° C. This compares favorably to typical reflow temperatures for tin-lead eutectic solder which is typically reflowed at temperatures between about 230° C. and about 240° C. Moreover, the protective organic coating can withstand multiple lead-free reflow processes.

Finally, the protective organic coating has been observed to not negatively impact visual appearance and the solderability of the copper substrate. Solderability is shown by wetting balance testing and contact resistance.

Having described the invention in detail, it will be apparent that modifications and variations are possible without departing from the scope of the invention defined in the appended claims.

Example 1

Surface Treating Composition of the Invention

A surface treating composition of the present invention was prepared in a low surface tension mineral oil solvent and having the following components:
n-decylphosphonic acid (12.4 g)
benzotriazole (3 g)
ISOPAR-H (to 1 L)
The solution was prepared by adding 12.4 grams of n-decylphosphonic acid and 3.0 grams of benzotriazole to 1 liter of ISOPAR® until all solids completely dissolve.

Comparative Example 1

Conventional Surface Treating Composition

A comparative surface treating composition of the present invention was prepared having the following components:
n-decylphosphonic acid (12.4 g)
ISOPAR-H (to 1 L)
The solution was prepared in a manner similar to that described above in Example 1, except that no benzotriazole was added.

Example 2

Surface Treating Composition of the Invention

A surface treating composition of the present invention was prepared in a low surface tension mineral oil solvent and having the following components:
n-decylphosphonic acid (12.4 g)
benzotriazole (3 g)
n-octadecyl mercaptan (5 g)
ISOPAR-H (to 1 L).

Example 3

Surface Treating Composition of the Invention

A surface treating composition of the present invention was prepared in a low surface tension mineral oil solvent and having the following components:
n-decyl phosphonic acid (1.3 g)
benzotriazole (2.7 g)
ISOPAR-H (685 g)
2-octanol (44 g).

Example 4

Treating Copper Substrate Comprising Nickel Underlayer and Gold Overlayer with Solutions of Example 1 and Comparative Example 1

Three copper coupons (copper alloy 725) were plated with a metallic surface coating. The metallic surface coating comprised a base metal layer comprising nickel (2.5 microns thickness) and a precious metal overlayer comprising gold (0.5 micron thickness). The nickel underlayers were plated using SULFAMEX® MLS, available from Enthone Inc. The gold overlayers were plated with a gold overlayer using AUTRONEX®, available from Enthone Inc. The gold plating was carried out according to the technical brochure provided by Enthone Inc.

After plating nickel/gold surface layers over the copper coupons: (A) one coupon was left untreated, (B) one coupon was treated with the surface treating composition of Comparative Example 1, and (C) one coupon was treated with the surface treating composition of Example 1. Treatment in the compositions of Example 1 and Comparative Example 1 involved dipping the coupons in the composition for 3 minutes while the compositions were heated to a temperature of 45° C.

Example 5

Porosity Testing of Treated and Untreated Copper Substrates Having Nickel Underlayer and Gold Overlayer The coupons of Example 4 were subjected to a twenty four hour $SO_2$ porosity test. The porosity test is based on ASTM standard B799. The standard protocol involves exposing the copper coupons to SO$_2$ vapor for 90 minutes followed by exposure to H$_2$S vapor for 15 minutes. For this example, the standard test was modified by increasing the exposure time to SO$_2$ vapor to 24 hours.

Porosity testing was carried out in two glass desiccators each having an inner diameter of 150 mm. In a first glass desiccator, SO$_2$ vapor was generated from a 6% of sulfurous acid (150 mL). In a second glass desiccator, H$_2$S vapor was generated from a 23.5% (NH$_4$)$_2$S solution (1 mL in 100 mL deionized water). The coupons were tested by exposing them to SO$_2$ vapor in the first glass desiccator for 24 hours and then to H$_2$S vapor in the second glass desiccator for 15 minutes.

Figure 6C:
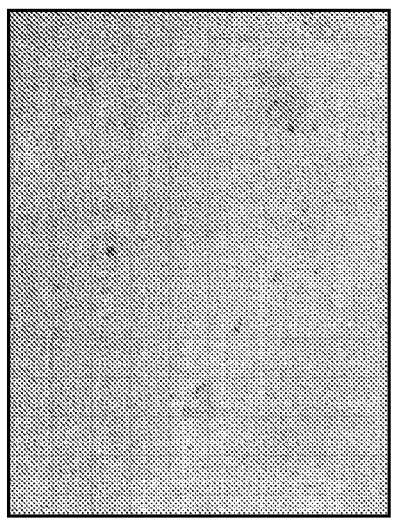
FIGS. 6A, 6B, and 6C are photographs of coupons comprising a copper alloy substrate plated with 2.5 μm of nickel underlayer and 0.5 μm of hard gold overlayer. The coupons were (A) untreated, (B) treated with the conventional surface treating composition of Comparative Example 1, and (C) treated with the surface treating composition of Example 1 and then subjected to a 24-hour $SO_2$ porosity test.
Figure 6B:
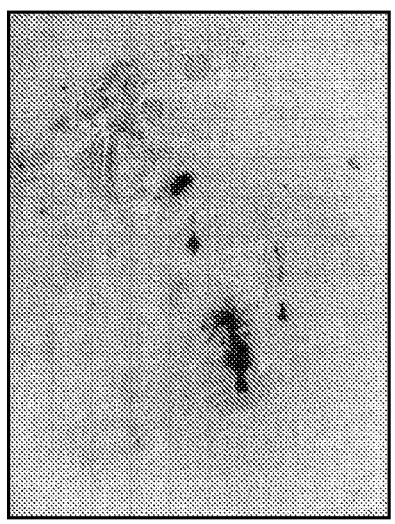
Figure 6A:
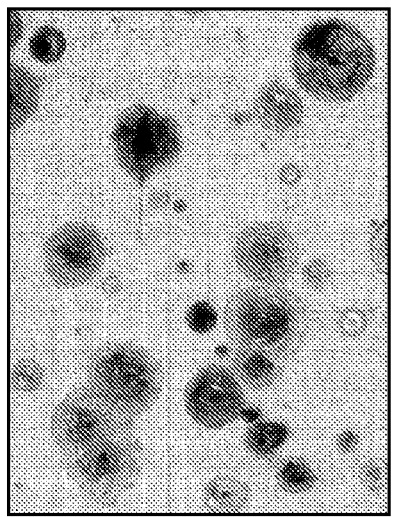

After the test, the coupons were visually inspected for surface corrosion. The results are shown in FIGS. 6A, 6B, and 6C, which are photographs of the coupons. FIG. 6A, which is a photograph of the untreated coupon, shows substantial surface corrosion. FIG. 6B, which is a photograph of the coupon treated with a conventional surface treating composition (Comparative Example 1), shows substantially reduced surface corrosion as compared to the untreated coupon. FIG. 6C, which is a photograph of the coupon treated with a surface treating composition of the present invention (Example 1), shows extremely minor surface corrosion as compared to both the untreated coupon and the coupon treated with the comparative surface treating composition.

Example 6

Porosity Testing of Copper Substrates having Thick and Thin Gold Layers

Copper alloy coupons having an underlayer of nickel and an overlayer of gold thereon were tested for corrosion resistance. The thicknesses of the gold overlayer were varied to determine if thinner gold overlayers can provide sufficient corrosion resistance if treated with the surface treating composition of the present invention. Six copper alloy coupons were plated with a nickel underlayer (2.5 microns thickness). The nickel underlayer was deposited using SULFAMEX® MLS, available from Enthone Inc. The six coupons were plated with a gold overlayer using AUTRONEX, available from Enthone Inc. The gold plating was carried out according to the technical brochure provided by Enthone Inc. The thicknesses of the gold overlayer were varied and the substrates were treated or untreated in a surface treatment composition as shown in the following Table 3:

TABLE 3

| Coupon Designation | Gold Overlayer Thickness | Treatment Conditions |
|---|---|---|
| A | 1.0 micron | Untreated |
| B | 0.5 micron | Untreated |
| C | 0.5 micron | Treated with Composition of Comparative Example 1 |
| D | 0.25 micron | Untreated |
| E | 0.25 micron | Treated with Composition of Comparative Example 1 |
| F | 0.25 micron | Treated with Composition of Example 1 |

Figure 7:
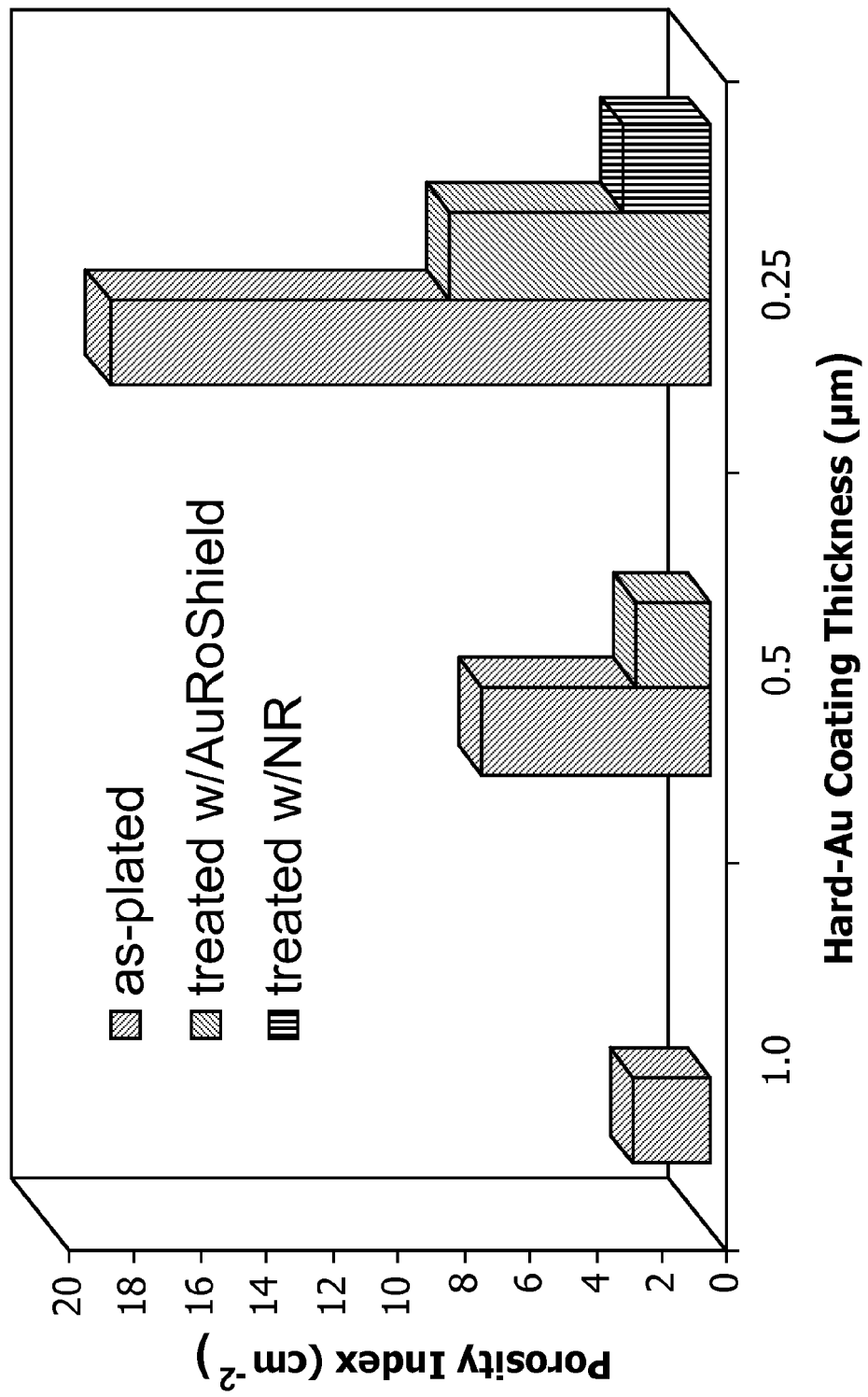
FIG. 7 is a graph showing porosity index as a function of hard gold overlayer overlayer thickness and treatment composition. Samples included untreated metallic surfaces having hard gold layers thicknesses of 1.0 μm, 0.5 μm, and 0.25 μm; metallic surfaces treated with the surface treating composition of Comparative Example 1 having hard gold layers thicknesses of 0.5 μm and 0.25 μm; and a metallic surface treated with the surface treating composition of Example 1 having hard gold layer thickness of 0.25 μm.

After treatment, the six coupons were subjected to the ASTM B799 porosity test similar to that described in Example 5. In this example, the standard was followed, such that the duration of exposure to SO$_2$ vapor was 1.5 hours. After testing, the porosity index of each coupon was determined using either an optical microscope or an SEM. These data were used to construct the graph shown in FIG. 7. From the graph, it is apparent that the copper coupon (F) plated with a very thin 0.25 µm gold overlayer and treated with the composition of Example 1 had a corrosion-resistance, as determined by the porosity index, comparable to that of the untreated copper coupon (A) plated with a 1.0 µm thick hard gold overlayer and the copper coupon (C) plated with a 0.5 µm thick hard gold overlayer and treated with the conventional surface treating composition of Comparative Example 1. By allowing the use of a thinner gold overlayer, manufacturing costs can be reduced.

Example 7

Surface Treating Composition of the Invention

A surface treating composition of the present invention was prepared in a low surface tension mixed alcohol/water solvent and having the following components:
n-octadecylphosphonic acid (3.0 g)
2-mercaptobenzimidazole (1.0 g)
2-butoxyethanol (500 mL)
Water (250 mL)

The solution was prepared by adding 3.0 grams of n-octadecylphosphonic acid to 500 mL of 2-butoxyethanol. The solution was heated to 50° C. for 1 hour to facilitate dissolution of the n-octadecyl phosphonic acid. Next, 250 mL water was added and finally, the 2-mercaptobenzimidazole. The components were added while maintaining the solution temperature at 50° C., and the solution was heated at this temperature for 1 hour to dissolve the components.

Example 8

Porosity Testing of Treated and Untreated Copper Substrates Having Nickel Underlayer and Gold Overlayer Nine copper coupons were coated with nickel underlayers and gold overlayers according to the method described in Example 4. One copper coupon was not treated in any post-treatment solution and served as the reference coupon. One of each of the remaining eight coupons were exposed to the surface treating composition comprising 1-octadecathiol (0.64 wt. %), octylphosphonic acid (1.2 wt. %), and benzotriazole (0.5 wt. %), in water with anionic and non-ionic surfactants.

The coupons were treated according to the conditions shown in the following Table 4:

TABLE 4

| | | Column | | | |
|---|---|---|---|---|---|
| Row | Temperature | 1 | 2 | 3 | 4 |
| A | 50° C. | 10 seconds | 30 seconds | 2 minutes | 5 minutes |
| B | 35° C. | 10 seconds | 30 seconds | 2 minutes | 5 minutes |

Figure 8:
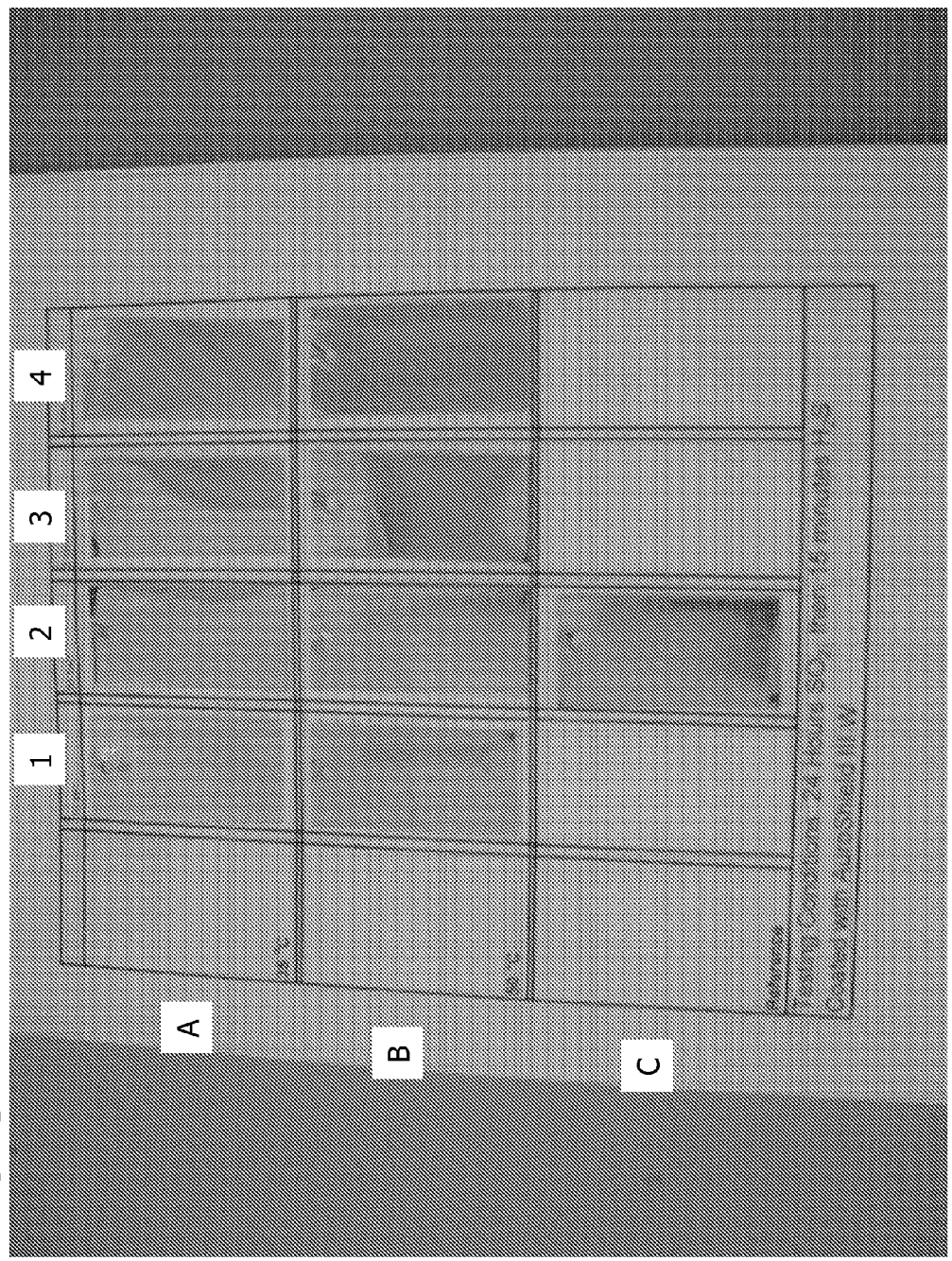
FIG. 8 is a photograph of copper coupons coated with nickel underlayers and gold overlayers. The coupons were treated with surface treating composition of the present invention and subjected to porosity testing as described in Example 8.

The nine coupons were subjected to porosity testing according to the method described in Example 5 (24 hours in SO$_2$ ambient atmosphere; 15 minutes in H$_2$S ambient atmosphere) and inspected visually. Photographs of the nine coupons are shown in FIG. 8. Row A includes the coupons treated at the composition temperature of 50° C., for respectively, 10 seconds (A1), 30 seconds (A2), 2 minutes (A3), and 5 minutes (A4), while Row B includes the coupons treated at the composition temperature of 35° C., for respectively, 10 seconds (B1), 30 seconds (B2), 2 minutes (B3), and 5 minutes (B4). The coupon in Row C is the reference coupon, which exhibited visible corrosion.

Figure 9:
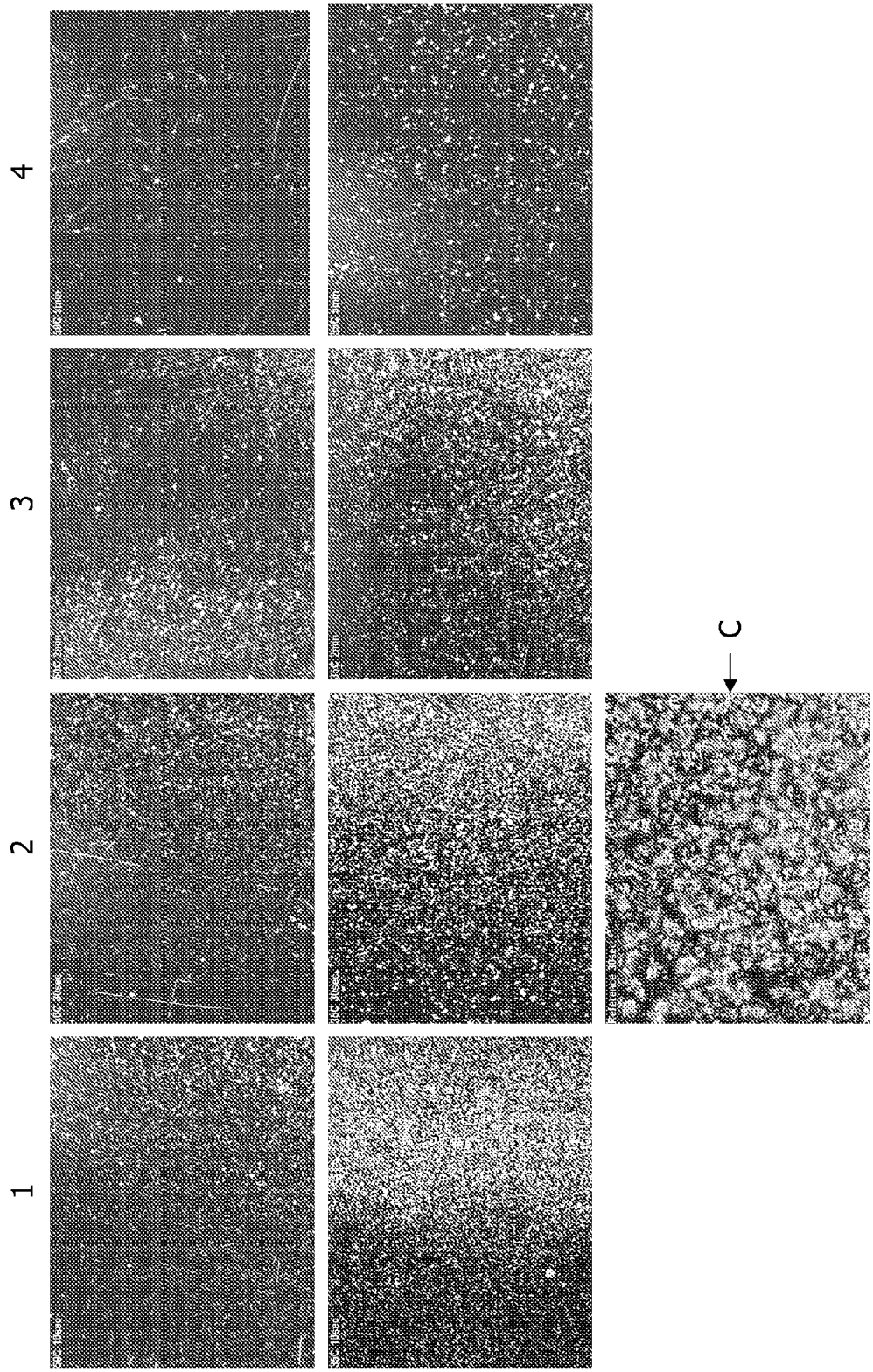
FIG. 9 are photomicrographs of copper coupons coated with nickel underlayers and gold overlayers. The coupons were treated with surface treating composition of the present invention and subjected to porosity testing as described in Example 8.

FIG. 9 shows photomicrographs of each coupon. At this level of detail, the reference coupon (Row C) appears substantially corroded while the coupons in Row B treated for 10 seconds (B1) and 30 seconds (B2) show significant, but less corrosion. The remaining coupons show lesser degrees of corrosion, while coupon A4 exhibits substantially no corrosion.

Example 9

Porosity Testing of Treated and Untreated Copper Substrates Having Nickel Underlayer and Gold Overlayer Twelve copper coupons were coated with nickel underlayers and gold overlayers according to the method described in Example 4. The thickness of the gold overlayers were varied, such that 3 coupons were coated with a 1.0 micrometer thick gold coating, 3 coupons were coated with a 0.5 micrometer gold coating, 3 coupons were coated with a 0.25 micrometer gold coating, and 3 coupons were coated with a 0.1 micrometer gold coating.

Four of the coupons (one of each gold coating thickness) were not treated in any post-treatment compositions and served as reference coupons. Four of the coupons (one of each gold coating thickness) were treated in the surface treatment composition of Example 7, and four of the coupons (one of each gold coating thickness) were treated in the surface treatment composition of Example 8. All twelve coupons were subjected to porosity testing according to the method described in Example 5 (24 hours in $SO_2$ ambient atmosphere; 15 minutes in $H_2S$ ambient atmosphere) and inspected visually.

Figure 10:
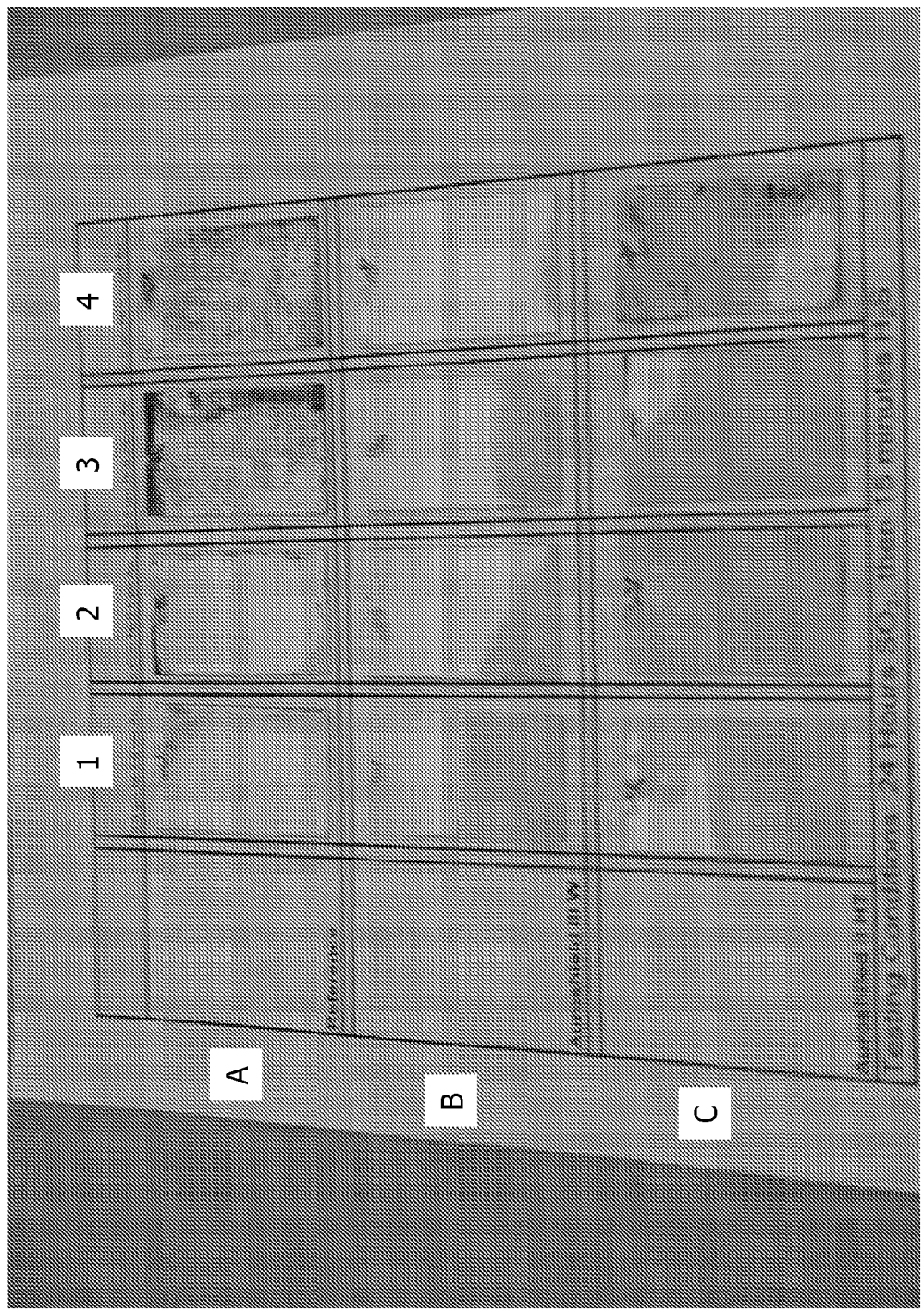
FIG. 10 is a photograph of copper coupons coated with nickel underlayers and gold overlayers. The coupons were treated with surface treating composition of the present invention and subjected to porosity testing as described in Example 9.
Figure 11B:
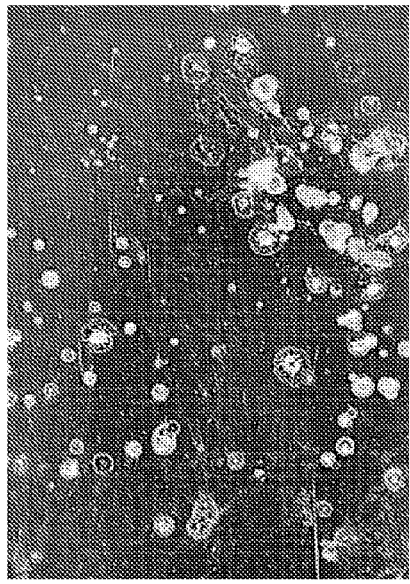
FIGS. 11A through 11D are photomicrographs of copper coupons coated with nickel underlayers and gold overlayers. These reference coupons were not treated with surface treatment composition prior to being subjected to porosity testing as described in Example 9.
Figure 11D:
Figure 11A:
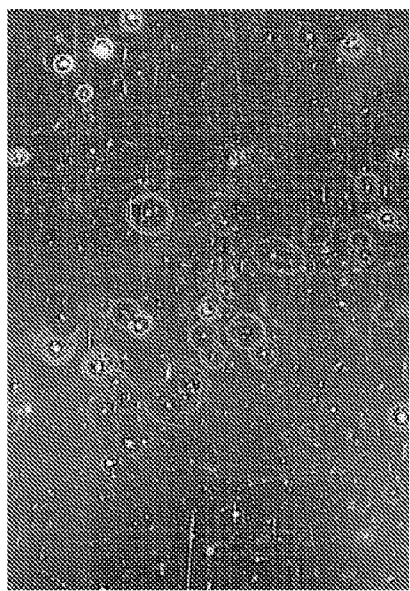
Figure 11C:
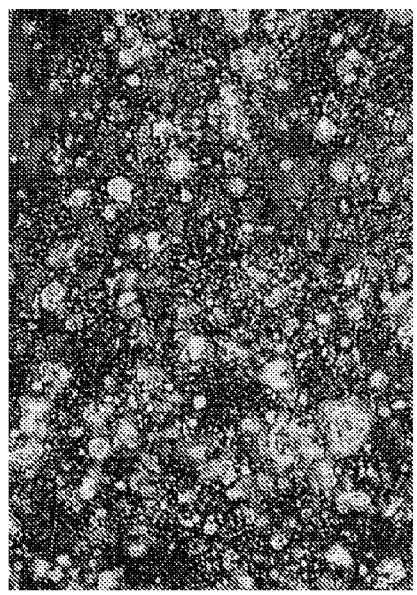

Photographs of the twelve coupons are shown in FIG. 10. The coupons in Row A are the reference coupons having a 1 micrometer gold coating (A1), a 0.5 micrometer gold coating (A2), a 0.25 micrometer gold coating (A3), and a 0.1 micrometer gold coating (A4). Even the coupon having the 1 micrometer thick gold overlayer exhibited some corrosion while the coupons having very thin gold layers exhibited significant corrosion. See also FIGS. 11A (1 micrometer thick gold coating), 11B (0.5 micrometer thick gold coating), 11C (0.25 micrometer thick gold coating), and 11D (0.1 micrometer thick gold coating), which are photomicrographs of the reference coupons. At this level of detail, it is apparent that untreated gold coatings, even at a thickness of one micrometer, are susceptible to corrosion.

Figure 12B:
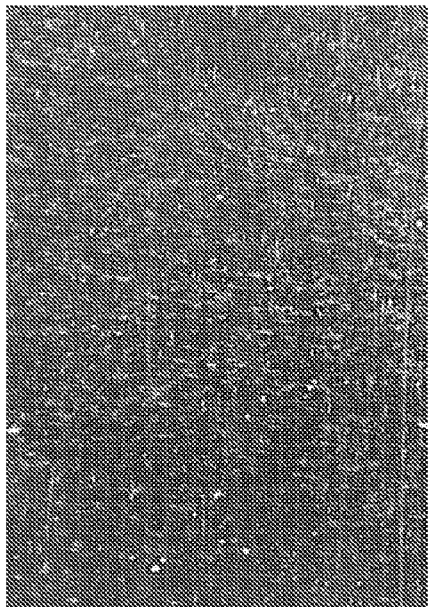
FIGS. 12A through 12D are photomicrographs of copper coupons coated with nickel underlayers and gold overlayers. These reference coupons were treated with surface treatment composition of the present invention prior to being subjected to porosity testing as described in Example 9.
Figure 12D:
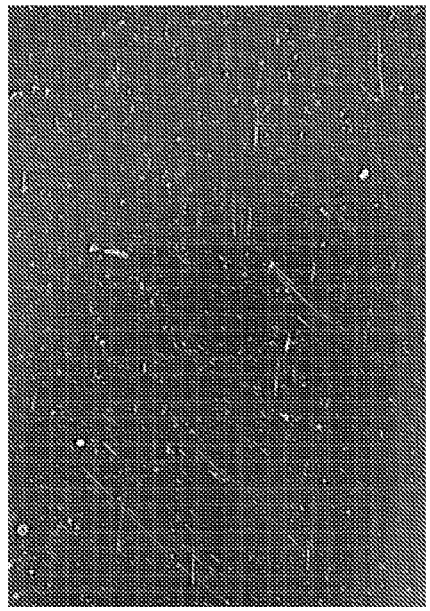
Figure 12A:
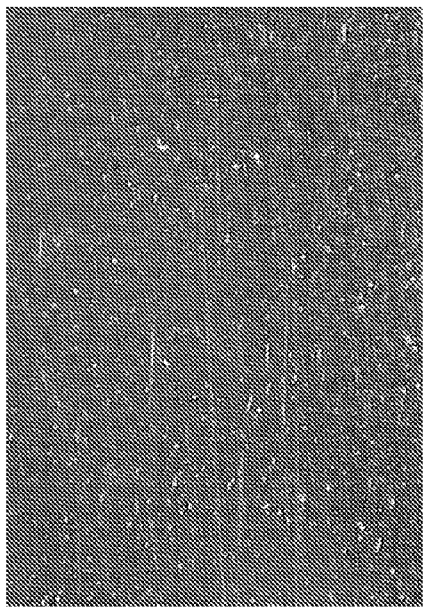
Figure 12C:
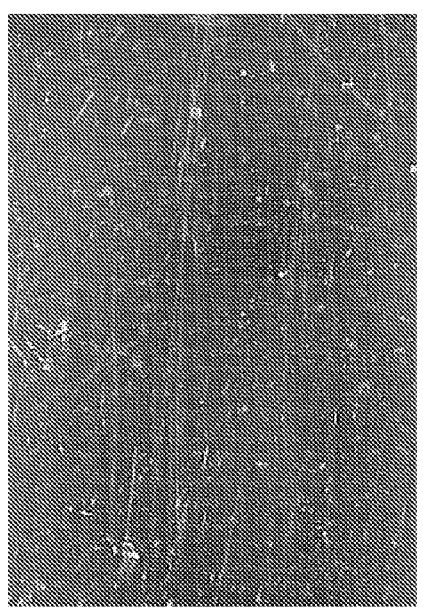

With reference again to FIG. 10, the coupons in Row B were treated with the surface treatment composition of Example 8. These coupons were plated with a 1 micrometer gold coating (B1), a 0.5 micrometer gold coating (B2), a 0.25 micrometer gold coating (B3), and a 0.1 micrometer gold coating (B4). The coupons treated in the surface treatment composition of Example 8 exhibited little or no corrosion, even where the gold overlayer is very thin. See also FIGS. 12A (1 micrometer thick gold coating), 12B (0.5 micrometer thick gold coating), 12C (0.25 micrometer thick gold coating), and 12D (0.1 micrometer thick gold coating), which are photomicrographs of the reference coupons. At this level of detail, it is apparent that the treated gold coatings resisted corrosion even when the coupons are coated with very thin gold overlayers.

Figure 13B:
FIGS. 13A through 13D are photomicrographs of copper coupons coated with nickel underlayers and gold overlayers. These reference coupons were treated with surface treatment composition of the present invention prior to being subjected to porosity testing as described in Example 9.
Figure 13D:
Figure 13A:
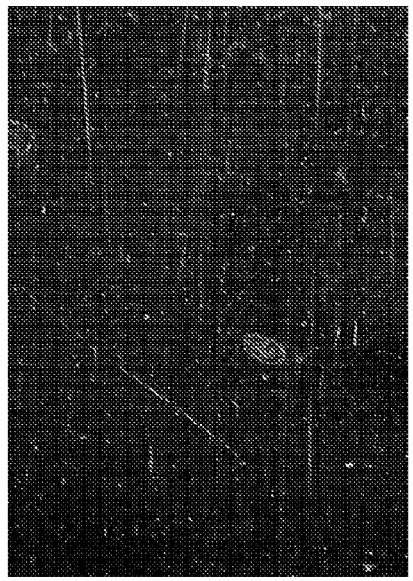
Figure 13C:
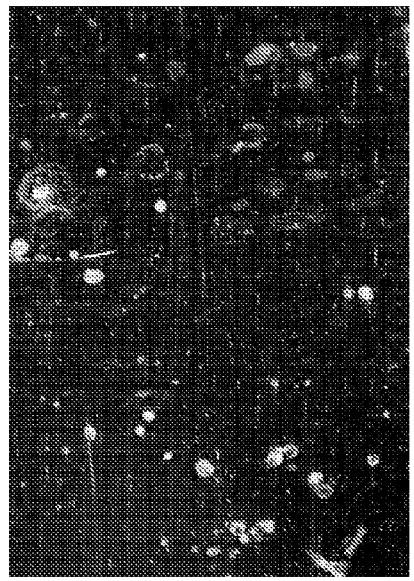

With reference again to FIG. 10, the coupons in Row C were treated with the surface treatment composition of Example 7. These coupons were plated with a 1 micrometer gold coating (C1), a 0.5 micrometer gold coating (C2), a 0.25 micrometer gold coating (C3), and a 0.1 micrometer gold coating (C4). While the coupon at C4 exhibited some corrosion, the remaining coupons treated in the surface treatment composition of Example 7 exhibited little or no visually apparent corrosion. See also FIGS. 13A (1 micrometer thick gold coating), 13B (0.5 micrometer thick gold coating), 13C (0.25 micrometer thick gold coating), and 13D (0.1 micrometer thick gold coating), which are photomicrographs of the reference coupons. At this level of detail, the corrosion of the coupons having 0.1 micrometer and 0.25 micrometer thick gold overlayer coatings is apparent, while the coupons having 0.5 and 1 micrometer gold coatings showed very little corrosion.

Example 10

Porosity Testing of Treated and Untreated Copper Substrates Having Nickel Underlayer and Gold Overlayer The twelve copper coupons of Example 9 were subjected to a high temperature Pb-free reflow and then subjected to porosity testing (10 hours in $SO_2$ ambient atmosphere; 15 minutes in $H_2S$ ambient atmosphere). Photomicrographs of the reflowed copper coupons are shown in FIGS. 14 through 16.

FIGS. 14A (1 micrometer thick gold coating), 14B (0.5 micrometer thick gold coating), 14C (0.25 micrometer thick gold coating), and 14D (0.1 micrometer thick gold coating) are photomicrographs of the reference coupons after one reflow profile. Each coupon exhibits substantial corrosion, even the coupon shown in FIG. 14A, with a 1 micrometer thick gold coating.

Figure 15B:
Figure 15D:
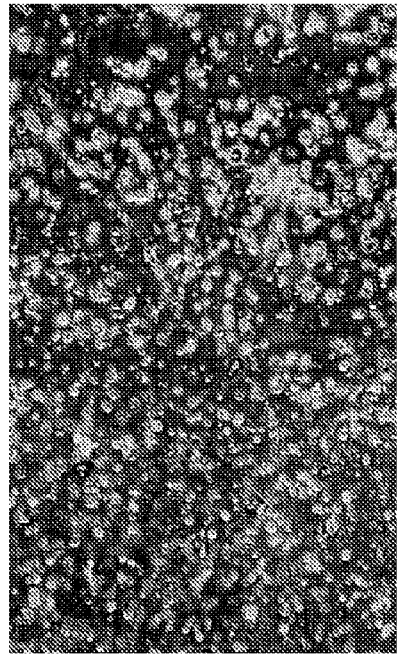
Figure 15A:
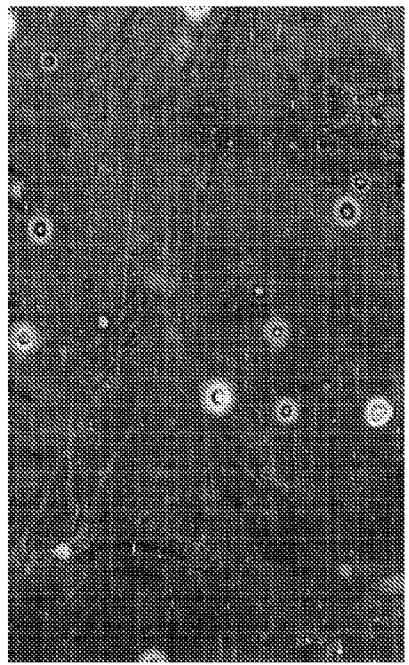
Figure 15C:
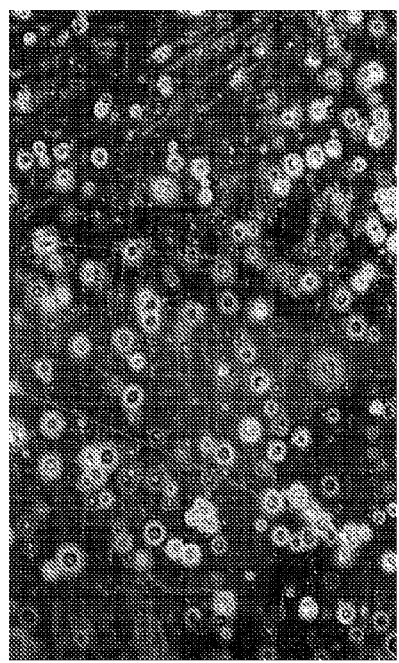

FIGS. 15A (1 micrometer thick gold coating), 15B (0.5 micrometer thick gold coating), 15C (0.25 micrometer thick gold coating), and 15D (0.1 micrometer thick gold coating) are photomicrographs of the coupons treated using the surface treatment composition of Example 8 after one reflow profile. While the coupons having the very thin coating (FIG. 15D) exhibits substantial corrosion, the coupons having thicker gold coatings exhibited substantially decreased corrosion compared to the reference counterparts shown in FIG. 14.

Figure 16B:
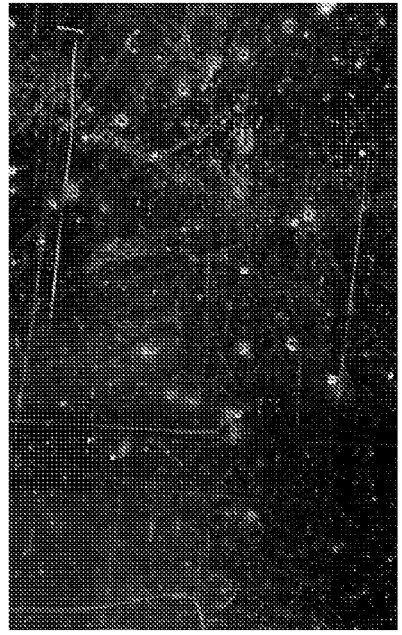
Figure 16D:
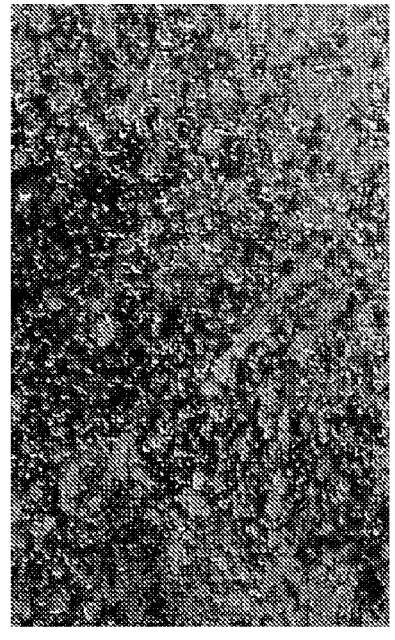
Figure 16A:
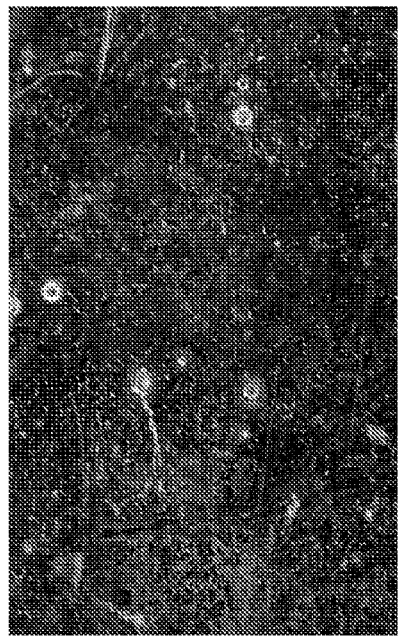
Figure 16C:
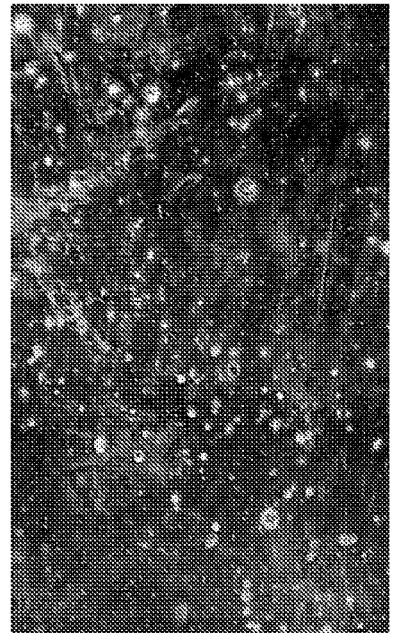

FIGS. 16A (1 micrometer thick gold coating), 16B (0.5 micrometer thick gold coating), 16C (0.25 micrometer thick gold coating), and 16D (0.1 micrometer thick gold coating) are photomicrographs of the coupons treated using the surface treatment composition of Example 7 after one reflow profile. While the coupons having the very thin coating (FIG. 16D) exhibits substantial corrosion, the coupons having thicker gold coatings exhibited substantially decreased corrosion compared to the reference counterparts shown in FIG. 14.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "a" layer means that there can be one or more such layers. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

We claim:

1. A method for enhancing the corrosion resistance, wear resistance, and contact resistance of a device comprising a copper or copper alloy substrate and having a metal layer comprising a base metal on a surface of the substrate, the method comprising:

exposing the device to the composition comprising:

a phosphorus oxide compound selected from the group consisting of a phosphonic acid, a phosphonate salt, a phosphonate ester, and mixtures thereof;

an organic compound comprising a nitrogen-containing functional group selected from the group consisting of amine, aromatic heterocycle comprising nitrogen, and a combination thereof; and a solvent having a surface tension less than about 50 dynes/cm as measured at 25° C. wherein the solvent comprises water and a surfactant.

2. The method of claim 1 wherein the phosphorus oxide compound has the structure (I):

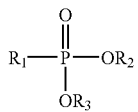

Structure (I)

wherein $R_1$ is a hydrocarbyl having between one and 24 carbon atoms; and $R_2$ and $R_3$ are each independently or together hydrogen, a charge balancing cation, or a hydrocarbyl having between one carbon atom and four carbon atoms.

3. The method of claim 2 wherein the phosphorus oxide compound is selected from the group consisting of methylphosphonic acid, dimethylphosphinic acid, ethylphosphonic acid, n-propylphosphonic acid, isopropylphosphonic acid, n-butylphosphonic acid, iso-butylphosphonic acid, tert-butylphosphonic acid, pentylphosphonic acids, hexylphosphonic acids, heptylphosphonic acids, n-octylphosphonic acid, n-decyl phosphonic acid, n-dodecyl phosphonic acid, (12-Phosphonododecyl)phosphonic acid, n-tetradecyl phosphonic acid, n-hexadecyl phosphonic acid, n-octadecyl phosphonic acid, diisooctylphosphinic acid, salts thereof, esters thereof, and combinations thereof.

4. The method of claim 2 wherein the phosphorus oxide compound is selected from the group consisting of vinylphosphonic acid, allylphosphonic acid, phenyl phosphonic acid, diphenylphosphinic acid, (2-isopropylphenyl)phosphonic acid, benzyl phosphonic acid, (ortho-tolyl)phosphonic acid, (meta-tolyl)phosphonic acid, (para-tolyl)phosphonic acid, (4-ethylphenyl)phosphonic acid, (2,3-xylyl)phosphonic acid, (2,4-xylyl)phosphonic acid, (2,5-xylyl)phosphonic acid, (3,4-xylyl)phosphonic acid, (3,5-xylyl)phosphonic acid, and combinations thereof.

5. The method of claim 1 wherein the organic compound comprising a nitrogen-containing functional group is the amine and has the structure (III):

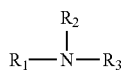

Structure (III)

wherein $R_1$, $R_2$, and $R_3$ are each independently hydrogen or a hydrocarbyl having between one carbon atom and about 24 carbon atoms, and at least one of $R_1$, $R_2$, and $R_3$ is a hydrocarbyl having between one carbon atom and about 24 carbon atoms.

6. The method of claim 5 wherein the amine is a primary amine selected from the group consisting of aminoethane, 1-aminopropane, 2-aminopropane, 1-aminobutane, 2-aminobutane, 1-amino-2-methylpropane, 2-amino-2-methylpropane, 1-aminopentane, 2-aminopentane, 3-aminopentane, neo-pentylamine, 1-aminohexane, 1-aminoheptane, 2-aminoheptane, 1-aminooctane, 2-aminooctane, 1-aminononane, 1-aminodecane, 1-aminododecane, 1-aminotridecane, 1-aminotetradecane, 1-aminopentadecane, 1-aminohexadecane, 1-aminoheptadecane, 1-aminooctadecane, and combinations thereof.

7. The method of claim 5 wherein the amine is a secondary amine selected from the group consisting of diethylamine, dipropylamines, dibutylamines, dipentylamines, dihexylamines, diheptylamines, dioctylamines, dinonylamines, didecylamines, diundecylamines, didodecylamines, ditridecylamines, ditetradecylamines, dihexadecylamines, dioctadecylamines, and combinations thereof.

8. The method of claim 5 wherein the amine is a tertiary amine selected from the group consisting of triethylamine, tripropylamines, tributylamines, tripentylamine, trihexylamines, triheptylamines, trioctylamines, trinonylamines, tridecylamines, triundecylamines, tridodecylamines, tritridecylamines, tritetradecylamines, trihexadecylamines, trioctadecylamines, and combinations thereof.

9. The method of claim 5 wherein the amine is a selected from the group consisting of ethylenediamine, 2-(Diisopropylamino)ethylamine, N,N'-Diethylethylenediamine, N-Isopropylethylenediamine, N-Methylethylenediamine, N,N-Dimethylethylenediamine, 1-dimethylamino-2-propylamine, 3-(Dibutylamino)propylamine, 3-(Diethylamino)propylamine, 3-(Dimethylamino)-1-propylamine, 3-(Methylamino)propylamine, N-Methyl-1,3-diaminopropane, N,N-Diethyl-1,3-propanediamine, and others.

10. The method of claim 1 wherein the organic compound comprising a nitrogen-containing functional group is the aromatic heterocycle comprising nitrogen and has the following structure (IV):

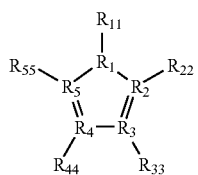

Structure (IV)

wherein $R_1$, $R_2$, $R_3$, $R_4$, and $R_5$ is an atom selected from the group consisting of carbon and nitrogen wherein between one and four of the $R_1$, $R_2$, $R_3$, $R_4$, and $R_5$ groups are nitrogen and between one and four of the $R_1$, $R_2$, $R_3$, $R_4$, and $R_5$ groups are carbon; and $R_{11}$, $R_{22}$, $R_{33}$, $R_{44}$, and $R_{55}$ are each independently selected from the group consisting of hydrogen, carbon, sulfur, oxygen, and nitrogen.

11. The method of claim 10 wherein the aromatic heterocycle comprising nitrogen is selected from the group consisting of pyrrole (1H-azole); imidazole (1,3-diazole); pyrazole (1,2-diazole); 1,2,3-triazole; 1,2,4-triazole; tetrazole; isoindole; benzimidazole (1,3-benzodiazole); indazole (1,2-benzodiazole); 1H-benzotriazole; 2H-benzotriazole; imidazo[4,5-b]pyridine; indole (1H-Benzo[b]pyrrole); purine (7H-Imidazo(4,5-d)pyrimidine); pyrazolo[3,4-d]pyrimidine; Triazolo[4,5-d]pyrimidine; derivatives thereof, and combinations thereof.

12. The method of claim 10 wherein the aromatic heterocycle comprising nitrogen is selected from the group consisting of imidazole (1,3-diazole), benzimidazole (1,3-benzodiazole), 1H-benzotriazole, and 2H-benzotriazole.

13. The method of claim 1 wherein a concentration of the phosphorus oxide compound is between about 0.1% by weight and about 5% by weight and a concentration of the aromatic heterocycle comprising nitrogen is between about 0.1% by weight and about 1.0% by weight.

14. The method of claim 1 wherein the solvent has a surface tension less than about 40 dynes/cm as measured at 25° C.

15. The method of claim 1 wherein the surfactant comprises a polyether, an ethoxylated glycerol ester, a sulfate ester, and combinations thereof.

16. The method of claim 1 wherein the composition further comprises a thiol having the following general structure (V):

 Structure (V)

wherein $R_1$ is a hydrocarbyl having from one carbon atom to about 24 carbon atoms, an aryl having from about five to about fourteen carbon atoms, or an arylhydrocarbyl wherein the hydrocarbyl has from one carbon atom to about 24 carbon atoms and the aryl has from about five to about fourteen carbon atoms.

17. The method of claim 16 wherein $R_1$ is the hydrocarbyl and the thiol is selected from the group consisting of ethanethiol; 1-propanethiol; 2-propanethiol; 2-propene-1-thiol; 1-butanethiol; 2-butanethiol; 2-methyl-1-propanethiol; 2-methyl-2-propanethiol; 2-methyl-1-butanethiol; 1-pentanethiol; 2,2-dimethyl-1-propanethiol; 1-hexanethiol; 1,6-hexanedithiol; 1-heptanethiol; 2-ethylhexanethiol; 1-octanethiol; 1,8-octanedithiol; 1-nonanethiol; 1,9-nonanedithiol; 1-decanethiol; 1-adamantanethiol; 1,11-undecanedithiol; 1-undecanethiol; 1-dodecanethiol; tert-dodecylmercaptan; 1-tridecanethiol; 1-tetradecanethiol; 1-pentadecanethiol; 1-hexadecanethiol; 1-heptadecanethiol; 1-octadecanethiol; 1-nonadecanethiol; 1-icosanethiol; and combinations thereof.

18. The method of claim 16 wherein the $R_1$ comprises the aryl or the arylhydrocarbyl and the thiol is selected from the group consisting of benzenethiol; 2-methylbenzenethiol; 3-methylbenzenethiol; 4-methylbenzenethiol; 2-ethylbenzenethiol; 3-ethylbenzenethiol; 4-ethylbenzenethiol; 2-propylbenzenethiol; 3-propylbenzenethiol; 4-propylbenzenethiol; 2-tert-butylbenzenethiol; 4-tert-butylbenzenethiol; 4-pentylbenzenethiol; 4-hexylbenzenethiol; 4-heptylbenzenethiol; 4-octylbenzenethiol; 4-nonylbenzenethiol; 4-decylbenzenethiol; benzyl mercaptan; 2,4-xylenethiol, furfuryl mercaptan; 1-naphthalenethiol; 2-naphthalenethiol; 4,4'-dimercaptobiphenyl; and combinations thereof.

19. The method of claim 1 wherein the organic compound comprising a nitrogen-containing functional group further comprises a sulfur-containing functional group.

20. The method of claim 19 wherein the organic compound comprises a hydrocarbyl linking group that links the nitrogen-containing functional group and a thiol through a hydrocarbyl chain and has a general structure (VII):

 Structure (VII)

wherein $R_1$ is a hydrocarbyl having between one carbon atom and about 24 carbon atoms, an aryl having between about five and about fourteen carbon atoms, or an arylhydrocarbyl wherein the hydrocarbyl has from one carbon atom to about 24 carbon atoms and the aryl has from about five to about fourteen carbon atoms; and the $R_2$ and $R_3$ are each independently, a carbon atom, a nitrogen atom, or a hydrogen atom.

21. The method of claim 1 wherein the solvent comprises 2-butoxyethanol.

22. The method of claim 1 wherein said metal layer on the surface of the substrate comprises a base metal selected from the group consisting of nickel, tin, zinc, chromium, titanium, aluminum, tantalum, zirconium, hafnium, molybdenum, tungsten, and alloys thereof.

23. The method of claim 22 wherein the said metal layer comprising the base metal is deposited on the copper or copper alloy substrate by immersion deposition.

24. The method of claim 22 wherein the solvent comprises 2-butoxyethanol.

25. The method of claim 1 wherein said base metal is selected from the group consisting of nickel, tin, zinc, chromium, titanium, aluminum, tantalum, zirconium, hafnium, molybdenum, tungsten, and alloys thereof; and
said device further comprises a layer comprising a precious metal over said layer comprising a base metal, said precious metal being selected from the group consisting of gold, silver, platinum, palladium, and alloys thereof.

26. The method of claim 25 wherein said base metal comprises nickel, tin, or a combination thereof.

27. The method of claim 26 wherein said precious metal is selected from the group consisting of gold, silver, and palladium.

28. The method of claim 27 wherein said base metal comprises nickel and said precious metal comprises gold or silver.

29. The method of claim 27 wherein said base metal comprises tin and said precious metal comprises silver.

30. The method of claim 27 wherein said base metal comprises nickel and said precious metal comprises gold.

31. The method of claim 1 wherein said base metal comprises tin.

32. The method of claim 31 wherein the tin is deposited on the copper or copper alloy substrate by immersion deposition.

33. The method of claim 31 wherein the solvent comprises 2-butoxyethanol.

34. The method of claim 1 wherein said metal layer comprising a base metal comprises an alloy of tin selected from the group consisting of tin-lead, tin-copper, tin-silver, tin-silver-copper, tin-silver-copper antimony, tin-zinc, tin-zinc-bismuth, tin-antimony, tin-indium-silver-bismuth, tin-bismuth-silver, tin-bismuth, and tin-indium.

35. The method of claim 1 wherein said base metal comprises nickel.

36. The method of claim 1 wherein said base metal layer comprises pores and said phosphorus oxide compound forms a protective organic film over exposed surfaces of the base metal layer and within the pores thereof.

37. The method of claim 36 wherein said phosphorus oxide reacts with base metal oxide on exposed surfaces of the base metal layer and/or the pores thereof.

38. The method of claim 37 wherein said device further comprises a porous layer comprising a precious metal over said layer comprising a base metal, said precious metal being selected from the group consisting of gold, silver, platinum, palladium, and alloys thereof, said phosphorus oxide compound further filling in the pores in the precious metal layer.

39. A method as set forth in claim 1 wherein said phosphorus oxide compound is selected from the group consisting of methylene diphosphonic acid, phosphonoacetic acid, 3-phosphonopropionic acid, 6-phosphonohexanoic acid, 11-phosphonoundecanoic acid, 16-phosphonohexadecanoic acid, salts thereof, and esters thereof, and combinations thereof.

\* \* \* \* \*